(12) United States Patent
Tsuchiya et al.

(10) Patent No.: US 9,293,457 B2
(45) Date of Patent: Mar. 22, 2016

(54) SEMICONDUCTOR DEVICE

(71) Applicant: Renesas Electronics Corporation, Kawasaki-shi, Kanagawa (JP)

(72) Inventors: Hideaki Tsuchiya, Kanagawa (JP); Hiroshi Kimura, Kanagawa (JP); Takashi Ide, Kanagawa (JP); Yorinobu Kunimune, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/800,207

(22) Filed: Jul. 15, 2015

(65) Prior Publication Data

US 2016/0020207 A1 Jan. 21, 2016

(30) Foreign Application Priority Data

Jul. 15, 2014 (JP) .................................. 2014-145372

(51) Int. Cl.
| | | |
|---|---|---|
| *H01L 27/088* | (2006.01) | |
| *H01L 27/06* | (2006.01) | |
| *H01L 29/20* | (2006.01) | |
| *H01L 23/528* | (2006.01) | |
| *H01L 29/417* | (2006.01) | |
| *H01L 29/45* | (2006.01) | |
| *H01L 23/532* | (2006.01) | |

(52) U.S. Cl.
CPC ............ *H01L 27/088* (2013.01); *H01L 23/528* (2013.01); *H01L 23/53223* (2013.01); *H01L 27/0605* (2013.01); *H01L 29/2003* (2013.01); *H01L 29/41766* (2013.01); *H01L 29/452* (2013.01)

(58) Field of Classification Search
CPC . H01L 27/088; H01L 29/2003; H01L 29/452; H01L 29/41766; H01L 27/0605; H01L 23/53223; H01L 23/528
See application file for complete search history.

(56) References Cited

U.S. PATENT DOCUMENTS

2004/0129961 A1* 7/2004 Paz de Araujo ......... C30B 29/32
257/295
2012/0235210 A1 9/2012 Takemae
(Continued)

FOREIGN PATENT DOCUMENTS

JP 2001066631 A * 3/2001
JP 2014-022413 A 2/2014

OTHER PUBLICATIONS

Saito W et al: "High Breakdown Voltage Undoped AlGaN-GaN Power HEMT on Sapphire Substrate and Its Demonstration for DC-DC Converter Application", IEEE Transactions on Electron Devices, vol. 51, No. 11, Nov. 2004. pp. 1913-1917.
(Continued)

*Primary Examiner* — Michelle Mandala
(74) *Attorney, Agent, or Firm* — Shapiro, Gabor and Rosenberger, PLLC

(57) ABSTRACT

To enhance electromigration resistance of an electrode.
A drain electrode is partially formed on a side surface of a drain pad. In this case, the drain electrode is integrated with the drain pad and extends from the side surface of the drain pad in a first direction (y direction). A recessed portion is located in a region overlapping with the drain electrode in a plan view. At least a part of the drain electrode is buried in the recessed portion. A side surface of the recessed portion, which faces the drain pad, enters the drain pad in the first direction (y direction).

8 Claims, 29 Drawing Sheets

(56) References Cited

U.S. PATENT DOCUMENTS

2014/0015019 A1    1/2014    Okamoto et al.
2014/0110760 A1    4/2014    Nega et al.

OTHER PUBLICATIONS

Extended European Search Report issued Dec. 11, 2015, in European Patent Application No. 15175414.0.

* cited by examiner

FIG. 6
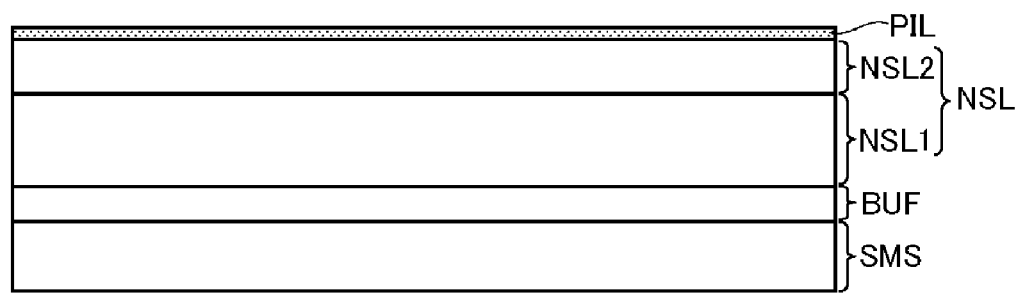
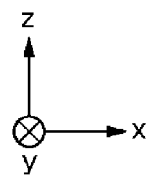
A-A'

FIG. 7
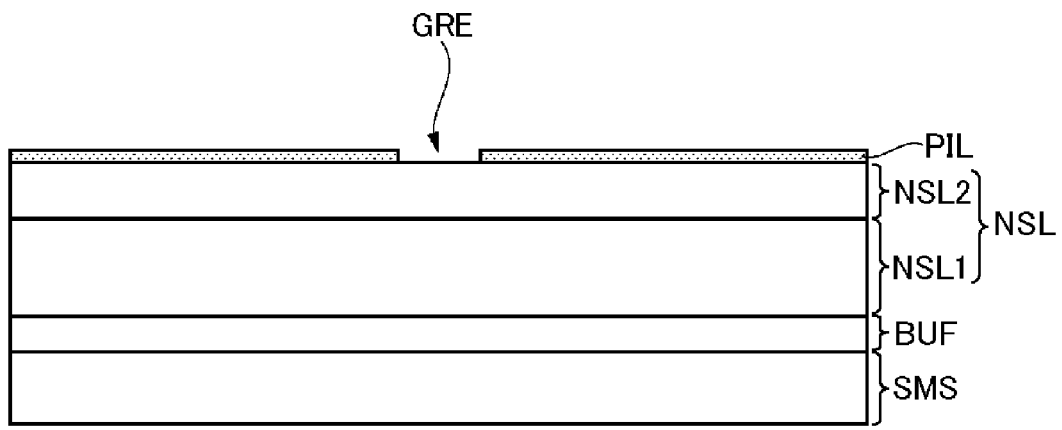
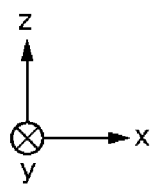
A-A'

SEMICONDUCTOR DEVICE

CROSS-REFERENCE TO RELATED APPLICATION

The disclosure of Japanese Patent Application No. 2014-145372 filed on Jul. 15, 2014 including the specification, drawings and abstract is incorporated herein by reference in its entirety.

BACKGROUND

The present invention relates to a semiconductor device, and for example, is a technique that can be applied to a power device.

A transistor using a nitride semiconductor layer may be used for a power device. Japanese Patent Laid-Open No. 2014-22413 (Patent literature 1) describes an example of such a power transistor. In the transistor described in Patent literature 1, an interlayer insulating film is formed over the nitride semiconductor layer. In addition, a drain pad, a source pad, a drain electrode, and a source electrode are provided over the interlayer insulating film. The drain electrode is provided to the drain pad in a comb teeth shape. In the same way, the source electrode is provided to the source pad in a comb teeth shape. In this case, the drain electrode and the source electrode are arranged to engage with each other.

Furthermore, in Patent literature 1, the drain electrode includes a recessed portion formed in the interlayer insulating film inside the drain electrode, in a plan view. A part of the drain electrode is buried in the recessed portion. The drain electrode is electrically coupled to the nitride semiconductor layer via the recessed portion. In the same way, the source electrode includes a recessed portion formed in the interlayer insulating film inside the source electrode in a plan view. A part of the source electrode is buried in the recessed portion. The source electrode is electrically coupled to the nitride semiconductor layer via the recessed portion.

SUMMARY

Problems to be Solved by the Invention

In general, electromigration often occurs in a region (current concentration region) in which the width of a current path gradually narrows toward the destination of the flow of the current. In particular, a large current may be flown through an electrode coupled to the nitride semiconductor layer. Therefore, when the current concentration region is formed in the electrode coupled to the nitride semiconductor layer, a structure achieving high electromigration resistance is required. The other purposes and new features will become clear from the description of the present specification and the accompanying drawings.

Means for Solving the Problems

According to an embodiment, an interlayer insulating film is located over the nitride semiconductor layer. Wiring is located over the interlayer insulating film. An electrode is partially formed on a first side surface of the wiring. The electrode is integrated with the wiring and the electrode extends in a first direction from the first side surface in a plan view. A recessed portion is formed in the interlayer insulating film. The recessed portion is located in a region overlapping with the electrode in a plan view. At least a part of the electrode is buried in the recessed portion. A barrier metal film is formed along the bottom surface and side surfaces of the recessed portion, the bottom surface of the wiring, and the bottom surface of the electrode. The wiring and the electrode contains aluminum. The barrier metal film contains titanium. A side surface of the recessed portion, which faces the wiring, reaches the first side surface of the wiring or enters the wiring in a first direction.

Effects of the Invention

According to the embodiment, the electromigration resistance of the electrode becomes high.

BRIEF DESCRIPTION OF THE DRAWINGS

FIG. 6 is a cross-sectional view showing a manufacturing method of the semiconductor device shown in FIGS. 1 to 3;

FIG. 7 is a cross-sectional view showing the manufacturing method of the semiconductor device shown in FIGS. 1 to 3;

DETAILED DESCRIPTION

Hereinafter, embodiments will be described with reference to the drawings. In all the drawings, the same reference symbol is given to the same component and the description thereof is appropriately omitted.

First Embodiment

Figure 1:
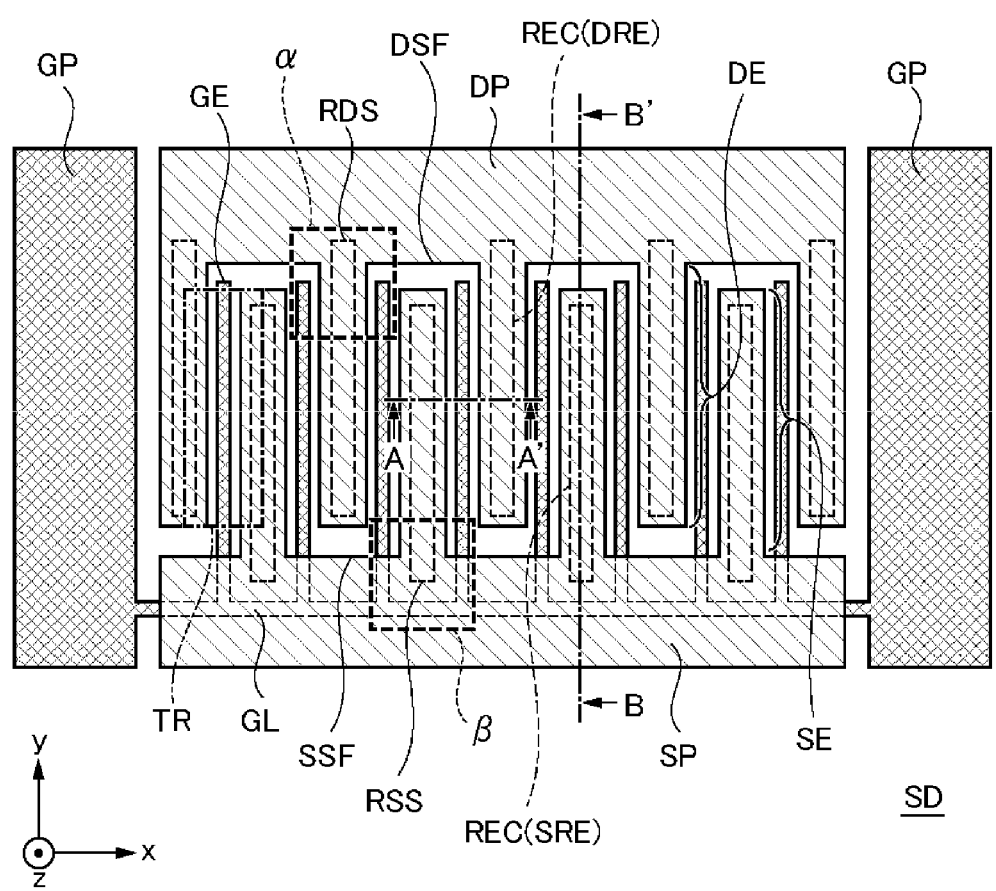
FIG. 1 is a plan view showing a configuration of a semiconductor device according to a first embodiment.
Figure 2:
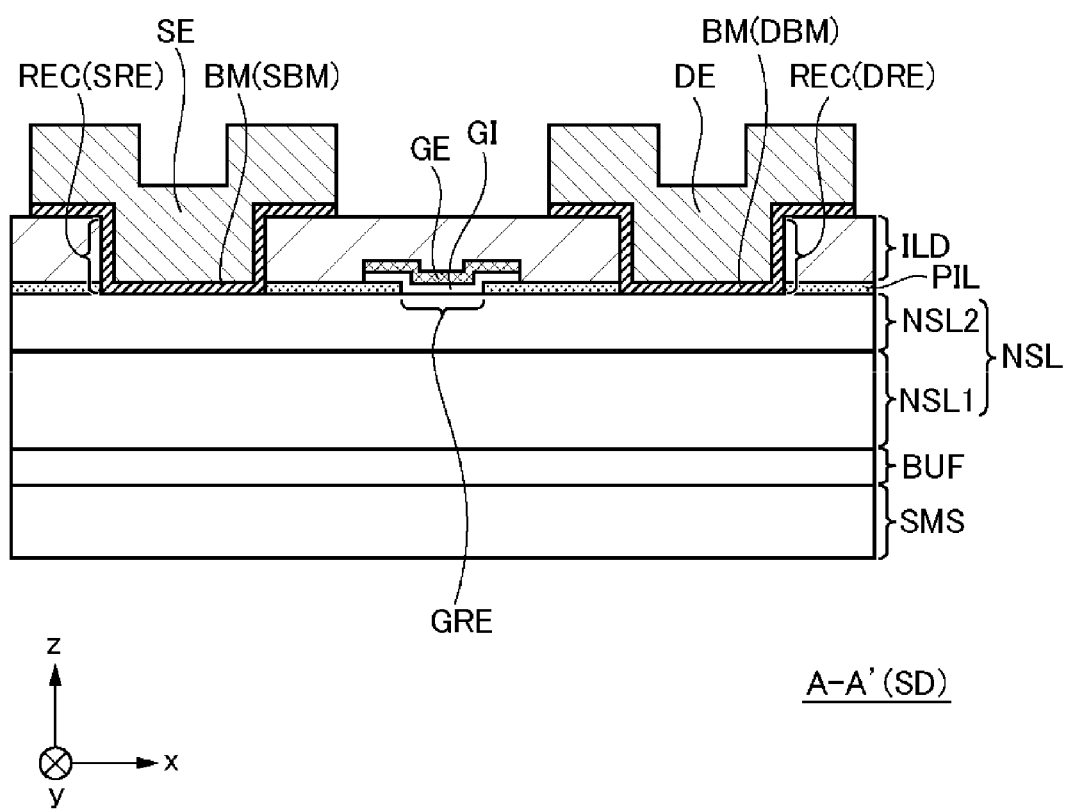
FIG. 2 is a cross-sectional view taken along line A-A' in FIG. 1.
Figure 3:
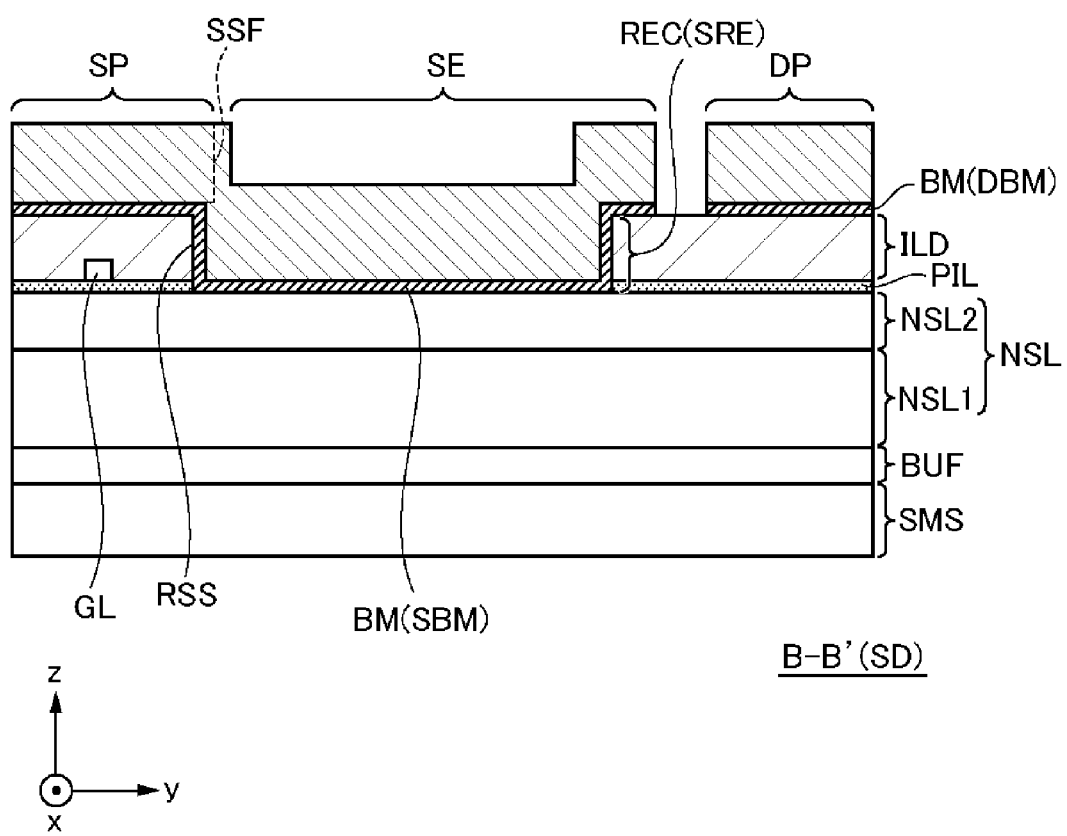
FIG. 3 is a cross-sectional view taken along line B-B' in FIG. 1.

FIG. 1 is a plan view showing a configuration of a semiconductor device SD according to a first embodiment. FIG. 2 is a cross-sectional view taken along line A-A' in FIG. 1. FIG. 3 is a cross-sectional view taken along line B-B' in FIG. 1. As shown in FIGS. 2 and 3, the semiconductor device SD includes a semiconductor substrate SMS, a buffer layer BUF, a nitride semiconductor layer NSL (a first nitride semiconductor layer NSL1 and a second nitride semiconductor layer NSL2), a protective insulating layer PIL (for example, silicon nitride film (SiN)), and an interlayer insulating film ILD (for example, silicone oxide film ($SiO_2$)). The semiconductor substrate SMS, the buffer layer BUF, the first nitride semiconductor layer NSL1, the second nitride semiconductor layer NSL2, the protective insulating layer PIL, and the interlayer insulating film ILD are laminated in this order.

A plan layout of the semiconductor device SD will be described using FIG. 1. As shown in FIG. 1, the semiconductor device SD includes a plurality of transistors TR, a drain pad DP (wiring), a source pad SP (wiring), a gate pad GP, a plurality of drain electrodes DE, a plurality of source electrodes SE, a plurality of gate electrodes GE, and a gate wiring GL.

Each transistor TR has the gate electrode GE, and includes a drain and a source in the nitride semiconductor layer NSL (see FIGS. 2 and 3). As described later, the gate electrode GE extends in a first direction (y direction). The drain electrode DE and the source electrode SE are electrically coupled to the drain and the source, respectively. In this case, in each transistor TR, the drain (drain electrode DE), the gate electrode GE, and the source (source electrode SE) are arranged in this order in a second direction (x direction) perpendicular to the first direction (y direction).

In the example shown in FIG. 1, the transistors TR are arranged in the second direction (x direction). Specifically, the gate electrodes GE of the transistors TR are arranged in the second direction (x direction). In the example shown in FIG. 1, the drain electrode DE, the gate electrode GE, the source electrode SE, and the gate electrode GE are repeatedly arranged in this order in the second direction (x direction). In this case, the drains of the transistors TR adjacent to each other via the drain electrode DE are electrically coupled to the same drain electrode DE. In the same way, the sources of the transistors TR adjacent to each other via the source electrode SE are electrically coupled to the same source electrode SE.

The drain pad DP and the source pad SP face each other via the transistor TR in the first direction (y direction) in a plan view. In addition, the drain pad DP and the source pad SP extend in the second direction (x direction). More specifically, each of the drain pad DP and the source pad SP has a rectangular planar shape whose longitudinal direction is the second direction (x direction).

The drain electrodes DE are formed on the drain pad DP in a comb teeth shape. In this case, the drain electrodes DE are formed integrally with the drain pad DP. In the same way, the source electrodes SE are formed on the source pad SP in a comb teeth shape. In this case, the source electrodes SE are formed integrally with the source pad SP. In addition, the drain electrodes DE and the source electrodes SE are arranged to engage with each other.

More specifically, the drain pad DP has the drain electrodes DE on the side surface (the side surface DSF: first side surface) facing the source pad SP. In this case, each drain electrode DE is partially formed on the side surface DSF of the drain pad DP. Furthermore, each drain electrode DE extends from the drain pad DP toward the source pad SP in the first direction (y direction). In the same way, the source pad SP has the source electrodes SE on the side surface (the side surface SSF: first side surface) facing the drain pad DP. In this case, each source electrode SE is partially formed on the side surface SSF of the source pad SP. Furthermore, each source electrode SE extends from the source pad SP side toward the drain pad DP side in the first direction (y direction). In addition, the source electrode SE and the drain electrode DE are repeatedly arranged in this order in the second direction (x direction).

Note that, in the example shown in FIG. 1, the widths of the respective drain electrodes DE are the same. However, the widths of the respective drain electrodes DE may be different from each other. In the same way, in the example shown in FIG. 1, the widths of the respective source electrodes SE are the same. However, the widths of the respective source electrodes SE may be different from each other.

As described later using FIGS. 2 and 3, a recessed portion REC is formed in the interlayer insulating film ILD (FIGS. 2 and 3). A planar shape of the recessed portion REC will be described using FIG. 1. A plurality of recessed portions REC is provided in a plan view. Each recessed portion REC is provided to each drain electrode DE and each source electrode SE in a plan view.

Specifically, the recessed portion REC (recessed portion DRE) provided to the drain electrode DE is located in a region overlapping with the drain electrode DE in a plan view. In the same way, the recessed portion REC (recessed portion SRE) provided to the source electrode SE is located in a region overlapping with the source electrode SE in a plan view. Furthermore, in the example shown in FIG. 1, the recessed portion DRE extends along the extending direction of the drain electrode DE (y direction). In the same way, the recessed portion SRE extends along the extending direction of the source electrode SE (y direction).

Note that, in the example shown in FIG. 1, the length of a portion of the recessed portion DRE overlapping with the drain electrode DE in a plan view in the first direction (y direction) is, for example, 75% or more and less than 100% relative to the length of the drain electrode DE in the first direction (y direction). In the same way, the length of a portion of the recessed portion SRE overlapping with the source electrode SE in a plan view in the first direction (y direction) is, for example, 75% or more and less than 100% relative to the length of the source electrode SE in the first direction (y direction). However, the lengths of the recessed portion DRE and the recessed portion SRE are not limited to the example described above.

Furthermore, in a plan view, the recessed portion DRE is sandwiched by the gate electrodes GE adjacent to each other via the drain electrode DE. In the same way, in a plan view, the recessed portion SRE is sandwiched by the gate electrodes GE adjacent to each other via the source electrode SE. Each gate electrode GE extends from the gate wiring GL in the first direction (y direction).

The gate wiring GL is located closer to the source pad SP than the drain electrode DE in a plan view. In this case, the gate wiring GL extends in the second direction (x direction). In addition, in the example shown in FIG. 1, one end of the gate wiring GL is coupled to one gate pad GP and the other end is coupled to another gate pad GP. Furthermore, the gate electrodes GE are formed on the gate wiring GL in a comb teeth shape. In this case, the gate electrodes GE are formed integrally with the gate wiring GL.

In the example shown in FIG. 1, the width of the recessed portion DRE in the second direction (x direction) is smaller than the width of the drain electrode DE in the second direction (x direction). In the same way, the width of the recessed portion SRE in the second direction (x direction) is smaller than the width of the source electrode SE in the second direction (x direction). In this case, as described later, the drain electrode DE is buried in the recessed portion REC in a region where the recessed portion REC is formed and the drain electrode DE is located over the interlayer insulating film ILD (FIGS. 2 and 3) in a region where the recessed portion REC is not formed. In the same way, the source electrode SE is buried in the recessed portion REC in a region where the recessed portion REC is formed, and the source electrode SE is located over the interlayer insulating film ILD (FIGS. 2 and 3) in a region where the recessed portion REC is not formed.

Note that the width of the recessed portion DRE in the second direction (x direction) may be equal to the width of the drain electrode DE in the second direction (x direction). In this case, in the second direction (x direction), the entire drain electrode DE is buried in the recessed portion DRE. In the same way, the width of the recessed portion SRE in the second direction (x direction) may be equal to the width of the source electrode SE in the second direction (x direction). In this case, in the second direction (x direction), the entire source electrode SE is buried in the recessed portion SRE.

Figure 4:
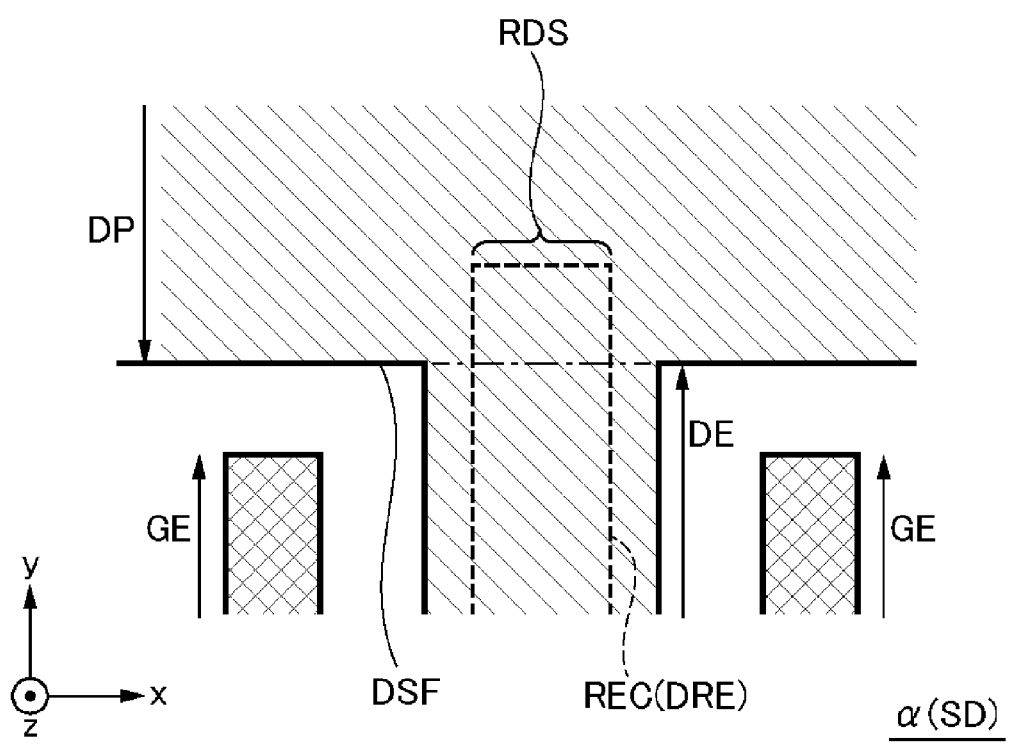
FIG. 4 is an enlarged view of a region surrounded by a dashed line α in FIG. 1.

FIG. 4 is an enlarged view of a region surrounded by a dashed line α in FIG. 1. As shown in FIG. 4, the side surface (the side surface RDS) of the recessed portion DRE, facing the drain pad DP, enters the drain pad DP in the first direction (y direction). In this case, a part of the drain pad DP is buried in the recessed portion DRE.

The length of a portion of the recessed portion DRE, which enters the drain pad DP, in the first direction (y direction) can be, for example, 300 nm. In this case, it is possible to cause the recessed portion DRE to reliably enter the drain pad DP. Specifically, even when the recessed portion DRE and the drain pad DP are designed so that a part of the recessed portion DRE enters the drain pad DP, the position of the recessed portion DRE may be shifted from the designed position due to, for example, an error in lithography. Even in such a case, when the recessed portion DRE satisfies the condition of the example described above in an actually manufactured layout, it is possible to cause the recessed portion DRE to reliably enter the drain pad DP.

Figure 5:
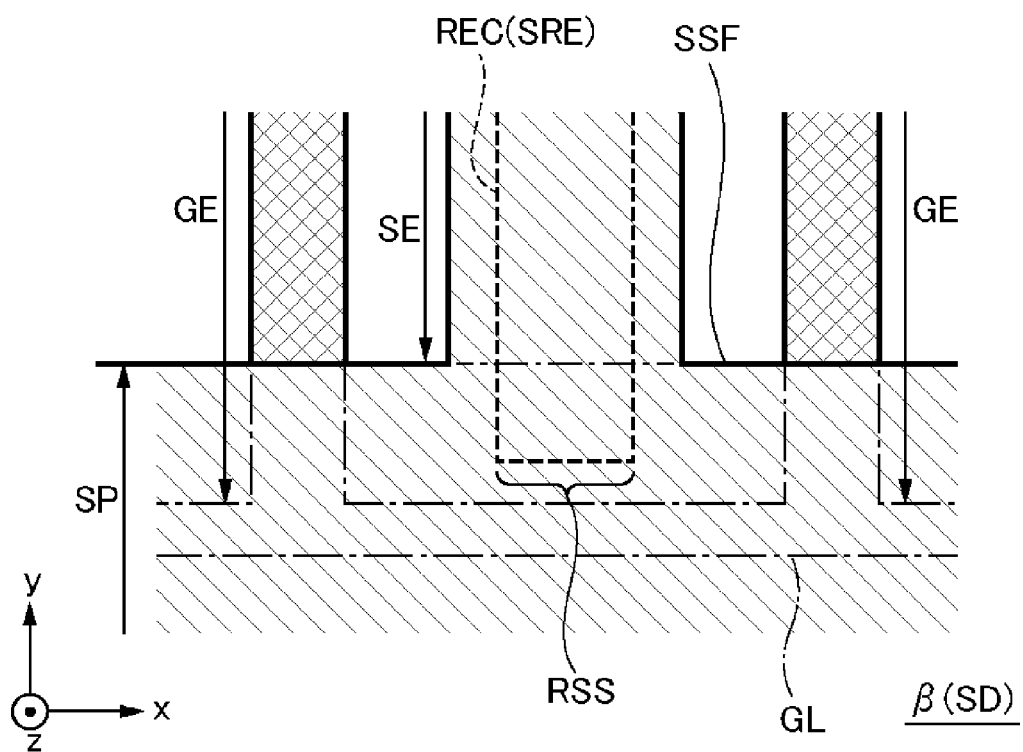
FIG. 5 is an enlarged view of a region surrounded by a dashed line β in FIG. 1.

FIG. 5 is an enlarged view of a region surrounded by a dashed line β in FIG. 1. As shown in FIG. 5, the side surface (the side surface RSS) of the recessed portion SRE, which faces the source pad SP, enters the source pad SP in the first direction (y direction). In this case, a part of the source pad SP is buried in the recessed portion SRE. Note that the length of a portion of the recessed portion SRE which enters the source pad SP in the first direction (y direction) can be, for example, the same as that of the above-described example of the recessed portion DRE.

Furthermore, in the example shown in FIG. 5, the gate wiring GL, the side surface SSF (side surface of the source pad SP where the source electrode SE is formed), and the source electrode SE are arranged in this order in the first direction (y direction). Thereby, it is possible to cause the recessed portion SRE to enter the source pad SP in the first direction (y direction). As described later, the recessed portion SRE is formed in the interlayer insulating film ILD (FIGS. 2 and 3). On the other hand, the gate wiring GL is buried in the interlayer insulating film ILD (FIG. 3). Therefore, the recessed portion SRE cannot be formed in a region overlapping with the gate wiring GL in a plan view. Accordingly, in the example shown in FIG. 3, the gate wiring GL is caused to enter the source pad SP in the first direction (y direction). In this case, as described above, it is possible to cause the recessed portion SRE to enter the source pad SP in the first direction (y direction).

Next, a cross-sectional structure of the semiconductor device SD will be described using FIGS. 2 and 3. The semiconductor substrate SMS is, for example, a silicon substrate, a SOI (Silicon On Insulator) substrate, a GaN substrate, or a SiC substrate. However, the semiconductor substrate SMS is not limited to these. Note that, for example, a sapphire substrate may be used instead of the semiconductor substrate SMS.

In the nitride semiconductor layer NSL, the first nitride semiconductor layer NSL1 and the second nitride semiconductor layer NSL2 form a heterojunction. Thereby, the first nitride semiconductor layer NSL1 forms two-dimensional electron gas (2DEG: 2-Dimensional Electron Gas) on the side of the second nitride semiconductor layer NSL2. The first nitride semiconductor layer NSL1 and the second nitride semiconductor layer NSL2 are formed by epitaxial growth and respectively are a GaN layer (the first nitride semiconductor layer NSL1) and an AlGaN layer (the second nitride semiconductor layer NSL2). However, the materials of the first nitride semiconductor layer NSL1 and the second nitride semiconductor layer NSL2 are not limited to the above example.

In the example shown in FIGS. 2 and 3, the buffer layer BUF is formed between the semiconductor substrate SMS and the nitride semiconductor layer NSL (the first nitride semiconductor layer NSL1). The buffer layer BUF has, for example, a superlattice structure of AlN/AlGaN. The buffer layer BUF suppresses occurrence of cracks in the semiconductor substrate SMS (for example, cracks that occur due to a difference of lattice constant between the semiconductor substrate SMS and the first nitride semiconductor layer NSL1).

As shown in FIG. 2, a recessed portion GRE is formed in the protective insulating layer PIL. In the example shown in FIG. 2, the lower end of the recessed portion GRE reaches the upper surface of the nitride semiconductor layer NSL (the second nitride semiconductor layer NSL2). In addition, a gate insulating film GI (for example, silicone oxide film ($SiO_2$), aluminum oxide ($Al_2O_3$), or hafnium oxide ($HfO_2$)) is formed along the bottom surface and side surfaces of the recessed portion GRE. Furthermore, the gate electrode GE is formed over the gate insulating film GI. Thereby, the recessed portion GRE is filled with the gate electrode GE. Furthermore, the gate electrode GE is covered by the interlayer insulating film ILD. Meanwhile, the gate electrode GE is formed of, for example, polysilicon or metal (for example, aluminum).

Note that, in the example shown in FIG. 2, the gate insulating film GI and the gate electrode GE are also formed around the recessed portion GRE. In this case, in a region where the recessed portion GRE is formed, the gate insulating film GI and the gate electrode GE are buried in the recessed portion GRE. In contrast, in a region where the recessed portion GRE is not formed, the gate insulating film GI and the gate electrode GE are located over the protective insulating layer PIL.

The recessed portions REC (the recessed portion DRE and the recessed portion SRE) are formed in the interlayer insulating film ILD. In the example shown in FIG. 2, the lower end of the recessed portion REC reaches the upper surface of the nitride semiconductor layer NSL (the second nitride semiconductor layer NSL2). A barrier metal film BM (a barrier metal film DBM) is formed along the bottom surface and side surfaces of the recessed portion DRE. In the same way, a barrier metal film BM (a barrier metal film SBM) is formed along the bottom surface and side surfaces of the recessed portion SRE. In addition, the drain electrode DE is formed over the barrier metal film DBM. Thereby, the recessed portion DRE is filled with the drain electrode DE. In the same way, the source electrode SE is formed over the barrier metal film SBM. Therefore, the recessed portion SRE is filled with the source electrode SE.

Note that, in the example shown in FIG. 2, the barrier metal film BM and the drain electrode DE (the source electrode SE) are also formed around the recessed portion REC. In this case, in a region where the recessed portion REC is formed, the barrier metal film BM and the drain electrode DE (the source electrode SE) are buried in the recessed portion REC. On the other hand, in a region where the recessed portion REC is not formed, the barrier metal film BM and the drain electrode DE (the source electrode SE) are located over the interlayer insulating film ILD.

In the example shown in FIG. 2, the barrier metal film BM is a single layer film formed of titanium (Ti). In addition, the drain electrode DE and the source electrode SE are formed of an aluminum alloy containing copper (AlCu). In this case, in the example shown in FIG. 2, a film (a barrier film) that suppresses reaction between titanium and aluminum is not formed between the barrier metal film BM and the drain electrode DE (the source electrode SE). In other words, the barrier metal film BM is directly coupled to the drain electrode DE (the source electrode SE). The barrier film is, for example, a film formed of titanium nitride (TiN). As described later in detail, in the example shown in FIG. 2, it is possible to suppress reaction between titanium (Ti) contained in the barrier metal film BM and aluminum (Al) contained in the drain electrode DE (the source electrode SE), even when not providing the barrier film.

Furthermore, when the barrier film is a film formed of titanium nitride (TiN), it is not necessary to use a high-temperature thermal process for forming an ohmic junction between the drain electrode DE (the source electrode SE) and the nitride semiconductor layer NSL. Specifically, the drain electrode DE (the source electrode SE) and the nitride semiconductor layer NSL are required to be electrically coupled to each other by the ohmic junction. In this case, when the film formed of titanium nitride (TiN) is included between the barrier metal film BM and the drain electrode DE (the source electrode SE), a high-temperature thermal process is required. On the other hand, in the example shown in FIG. 2, such a thermal process is not required.

However, the barrier metal film BM may be, for example, a titanium nitride/titanium (TiN/Ti) laminated film. Also in this case, when the thermal process described above is performed, it is possible to electrically couple the drain electrode DE (the source electrode SE) and the nitride semiconductor layer NSL by the ohmic junction. Furthermore, the barrier metal film BM is not limited to the example described above if the barrier metal film BM is a film containing titanium (Ti).

Moreover, the material of the drain electrode DE (the source electrode SE) is not limited to the example (AlCu) described above. The drain electrode DE (the source electrode SE) is formed by a film containing aluminum (Al). For example, the drain electrode DE (the source electrode SE) is a single layer film formed of aluminum (Al). As another example, the drain electrode DE (the source electrode SE) is an aluminum alloy (AlSiCu) containing silicon (Si) and copper (Cu).

As shown in FIG. 3, the gate wiring GL is provided over the protective insulating layer PIL. In addition, the gate wiring GL is covered by the interlayer insulating film ILD. Furthermore, the source pad SP is located above the gate wiring GL via the interlayer insulating film ILD.

As shown in FIG. 3, the source pad SP and the source electrode SE are integrally formed. Moreover, the barrier metal film BM is formed along the bottom surface and side surfaces of the recessed portion SRE and the bottom surface of the source pad SP. In addition, as described above, the side surface RSS of the recessed portion SRE enters the source pad SP in the first direction (y direction). Thereby, the side surface RSS, the side surface SSF (side surface of the source pad SP where the source electrode SE is formed), and the source electrode SE are arranged in this order in the first direction (y direction).

In the example shown in FIG. 3, a structure in which the nitride semiconductor layer NSL, the barrier metal film BM, and the source pad SP are laminated in this order in the thickness direction (z direction) is located between the side surface RSS and the side surface SSF in the first direction (y direction). In other words, an interface between the interlayer insulating film ILD and the barrier metal film BM (the barrier metal film SBM) is not formed in the thickness direction (z direction), between the side surface RSS and the side surface SSF in the first direction (y direction). In this case, as described later in detail, the electromigration resistance of the source electrode SE is high.

FIGS. 6 to 12 are cross-sectional views showing a manufacturing method of the semiconductor device SD shown in FIGS. 1 to 3, and correspond to FIG. 2. First, as shown in FIG. 6, the buffer layer BUF is formed over the semiconductor substrate SMS by, for example, MOCVD (Metal Organic Chemical Vapor Deposition). Next, the nitride semiconductor layer NSL (the first nitride semiconductor layer NSL1 and the second nitride semiconductor layer NSL2) is formed over the buffer layer BUF by, for example, epitaxial growth. Subsequently, the protective insulating layer PIL is formed over the nitride semiconductor layer NSL.

Then, as shown in FIG. 7, the recessed portion GRE is formed in the protective insulating layer PIL. In the example shown in FIG. 7, the recessed portion GRE penetrates through the protective insulating layer PIL. In addition, the lower end of the recessed portion GRE reaches the upper surface of the nitride semiconductor layer NSL (the second nitride semiconductor layer NSL2).

Figure 8:
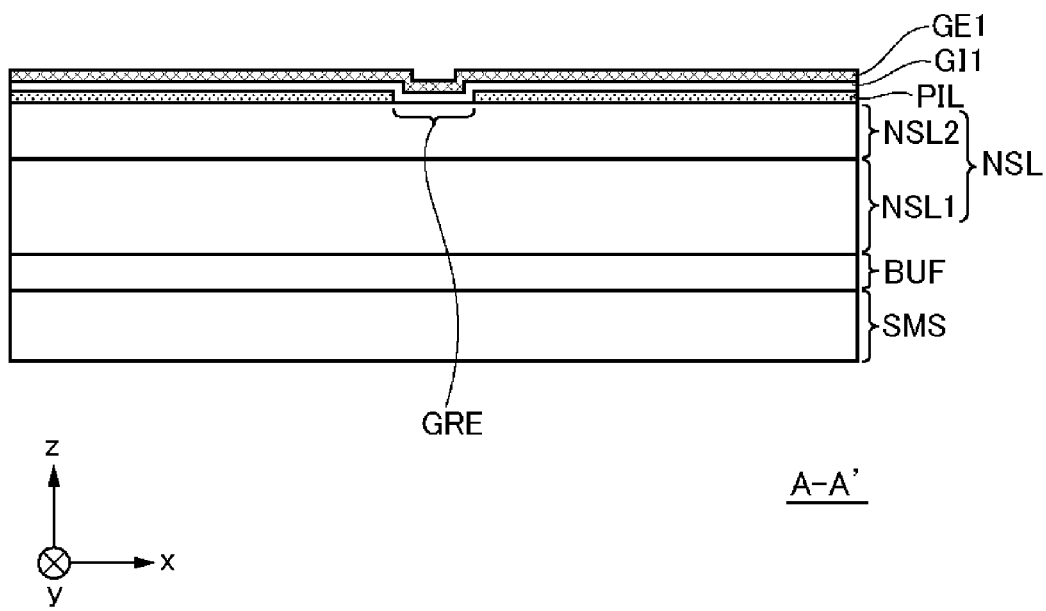
FIG. 8 is a cross-sectional view showing the manufacturing method of the semiconductor device shown in FIGS. 1 to 3.

After that, as shown in FIG. 8, the insulating film GI1 and a conductive film GE1 are laminated in this order over the protective insulating layer PIL. The insulating film GI1 is an insulating film serving as the gate insulating film GI. The conductive film GE1 is a conductive film serving as the gate electrode GE and the gate wiring GL. In the example shown in FIG. 8, a part of the insulating film GI1 and a part of the conductive film GE1 are buried in the recessed portion GRE.

Figure 9:
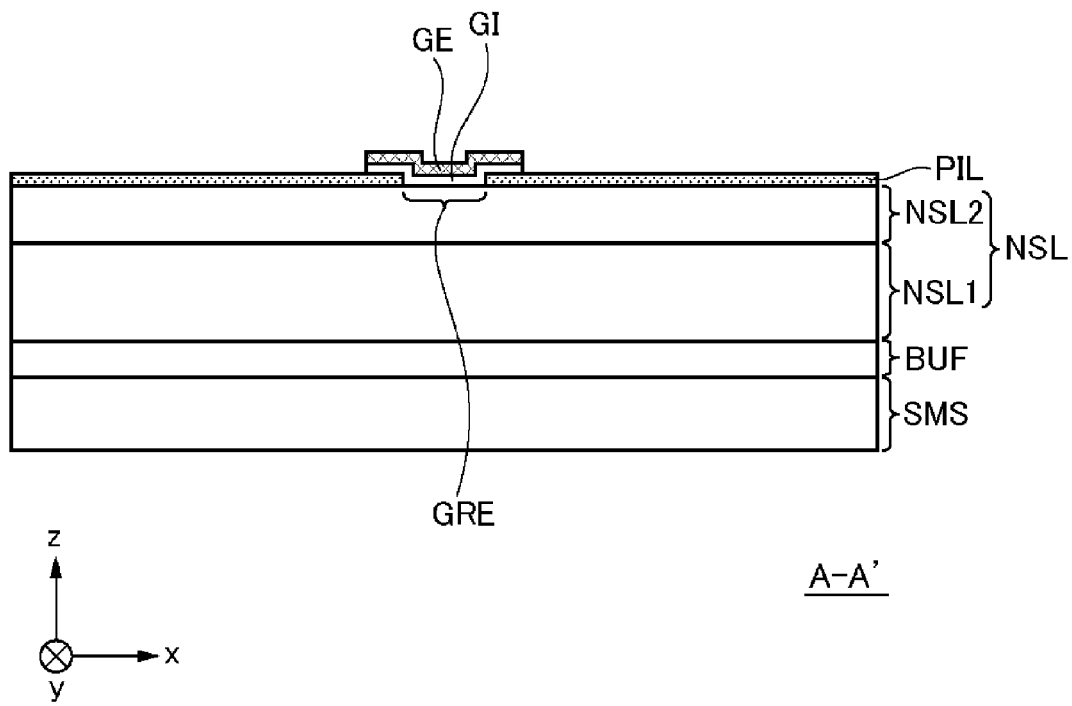
FIG. 9 is a cross-sectional view showing the manufacturing method of the semiconductor device shown in FIGS. 1 to 3.

Next, as shown in FIG. 9, the insulating film GI1 and a conductive film GE1 (FIG. 8) are patterned. Thereby, the gate insulating film GI and the gate electrode GE are formed. Note that, in this process, the gate wiring GL (FIGS. 1 and 3) is formed together with the gate electrode GE.

Figure 10:
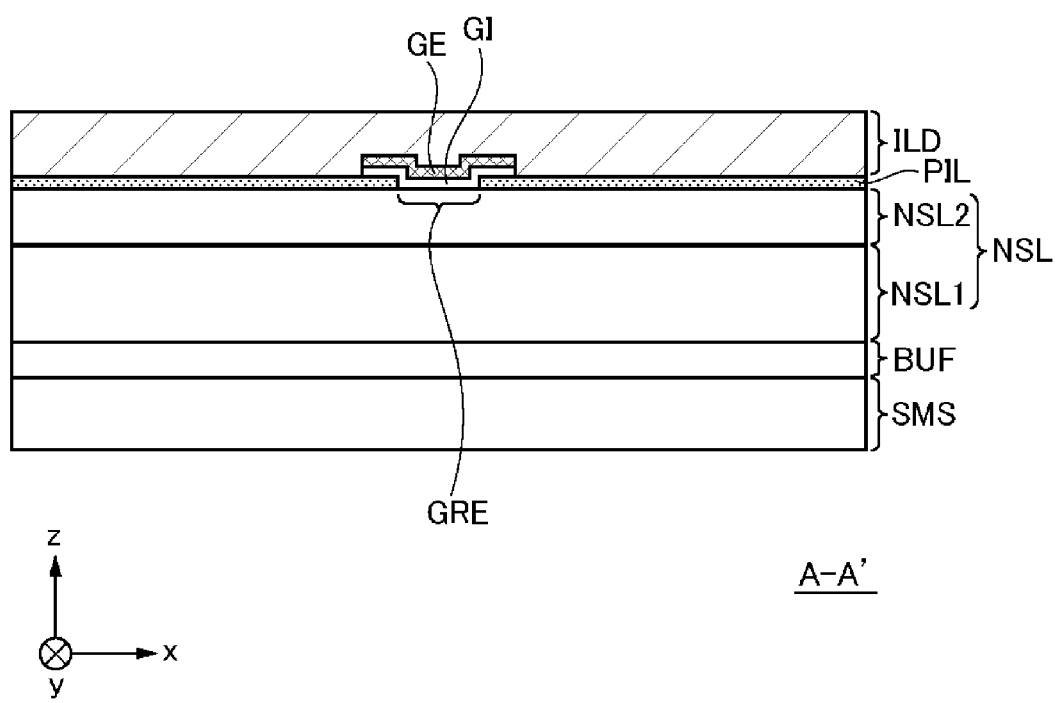
FIG. 10 is a cross-sectional view showing the manufacturing method of the semiconductor device shown in FIGS. 1 to 3.

Subsequently, as shown in FIG. 10, the interlayer insulating film ILD is formed over the protective insulating layer PIL and the gate electrode GE by, for example, CVD (Chemical Vapor Deposition). Thereby, the protective insulating layer PIL and the gate electrode GE are covered by the interlayer insulating film ILD.

Figure 11:
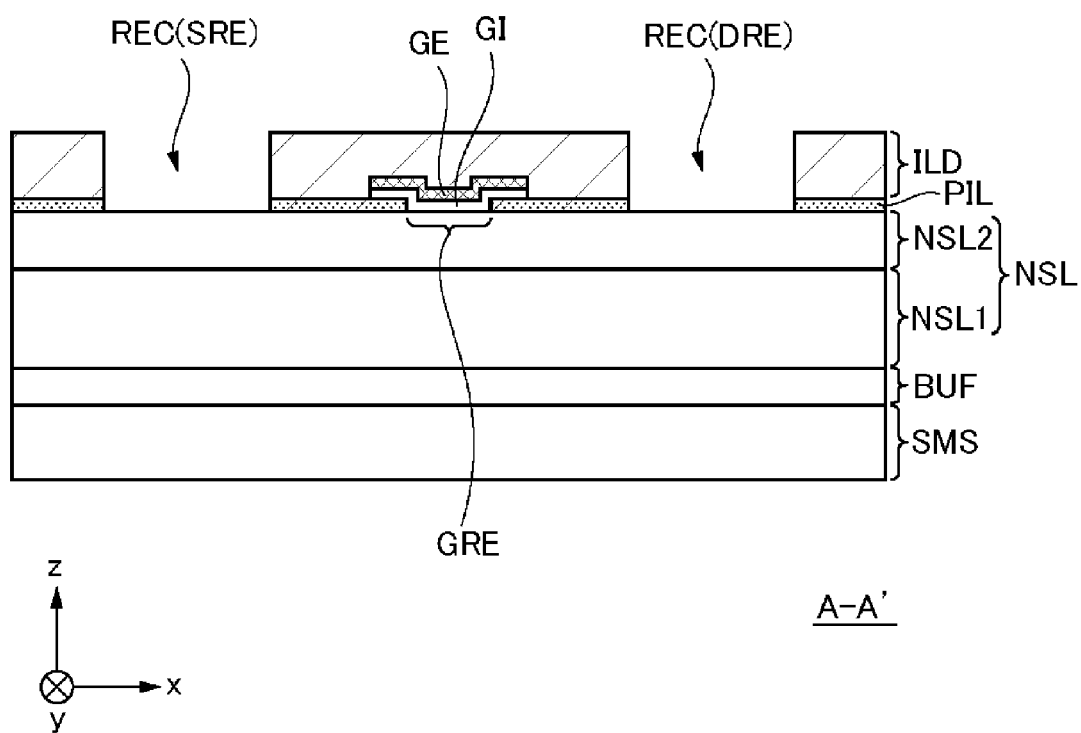
FIG. 11 is a cross-sectional view showing the manufacturing method of the semiconductor device shown in FIGS. 1 to 3.

Then, as shown in FIG. 11, the recessed portions REC (the recessed portion DRE and the recessed portion SRE) are formed in the interlayer insulating film ILD by lithography. In this case, the recessed portion REC penetrates through the interlayer insulating film ILD and the protective insulating layer PIL. In addition, the lower end of the recessed portion REC reaches the upper surface of the nitride semiconductor layer NSL (the second nitride semiconductor layer NSL2).

Figure 12:
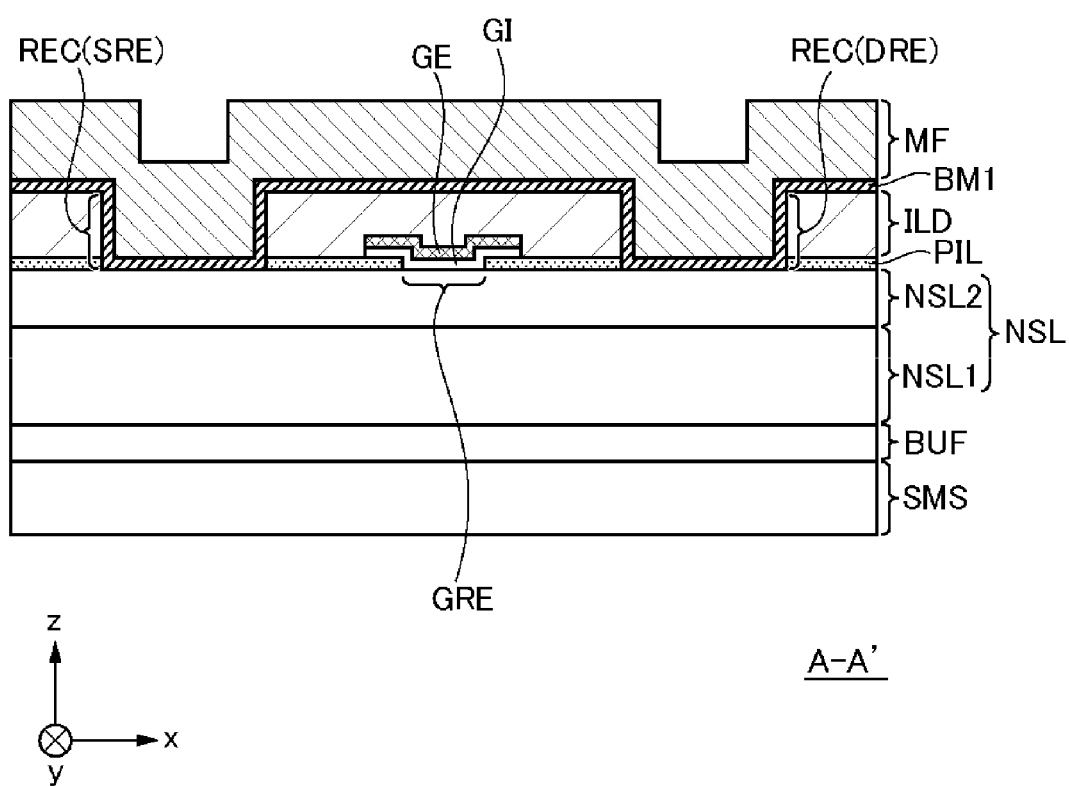
FIG. 12 is a cross-sectional view showing the manufacturing method of the semiconductor device shown in FIGS. 1 to 3.

After that, as shown in FIG. 12, the metal film BM1 is formed over the interlayer insulating film ILD by, for example, sputtering. The metal film BM1 is a metal film serving as the barrier metal film BM. Then, the metal film MF is formed over the metal film BM1 by, for example, sputtering. The metal film MF is a metal film serving as the drain pad DP, the source pad SP, the drain electrode DE, and the source electrode SE. In the example shown in FIG. 12, the metal film BM1 is formed along the bottom surface and side surfaces of the recessed portion REC and the upper surface of the interlayer insulating film ILD. In contrast, a part of the metal film MF is buried in the recessed portion REC.

Next, the metal film MF and the metal film BM1 are patterned. Thereby, the drain pad DP, the source pad SP, the drain electrode DE, and the source electrode SE are formed and the barrier metal film BM is formed. In this way, the semiconductor device SD shown in FIGS. 1 to 3 is manufactured.

Figure 13:
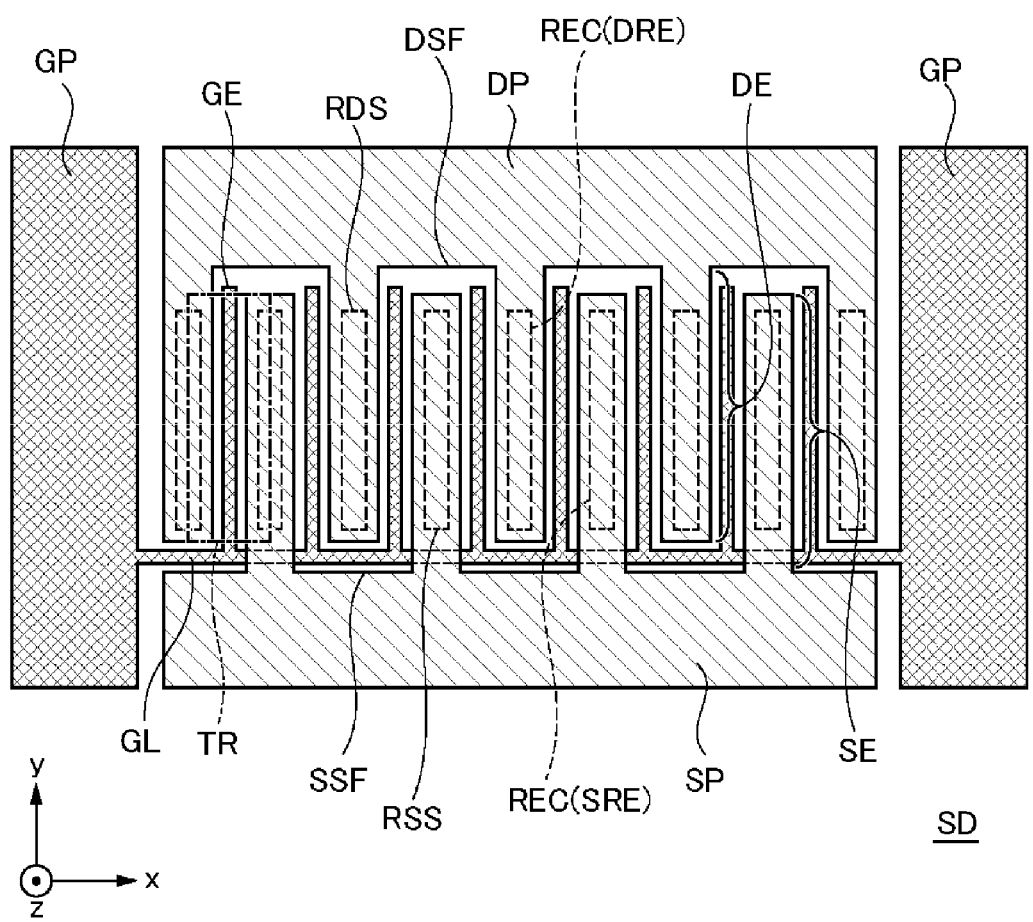
FIG. 13 is a plan view showing a configuration of a semiconductor device according to a comparative example.

FIG. 13 is a plan view showing a configuration of a semiconductor device SD according to a comparative example and corresponds to FIG. 1 of the present embodiment. The semiconductor device SD according to the comparative example is the same as the semiconductor device SD according to the present embodiment except for the following points.

As shown in FIG. 13, in the same way as in the present embodiment, the recessed portion DRE has the side surface RDS on the drain pad DP side. In the same way, the recessed portion SRE has the side surface RSS on the source pad SP side. In addition, in the example shown in FIG. 13, the side surface RDS is located opposite to the drain pad DP via the side surface DSF (the side surface of the drain pad DP where the drain electrode DE is formed) in the first direction (y direction). In the same way, the side surface RSS is located opposite to the source pad SP via the side surface SSF (the side surface of the source pad SP where the source electrode SE is formed) in the first direction (y direction). In other words, the side surface RDS enters the inside of the drain electrode DE in the first direction (y direction). In the same way, the side surface RSS enters the inside of the source electrode SE in the first direction (y direction).

Figure 14:
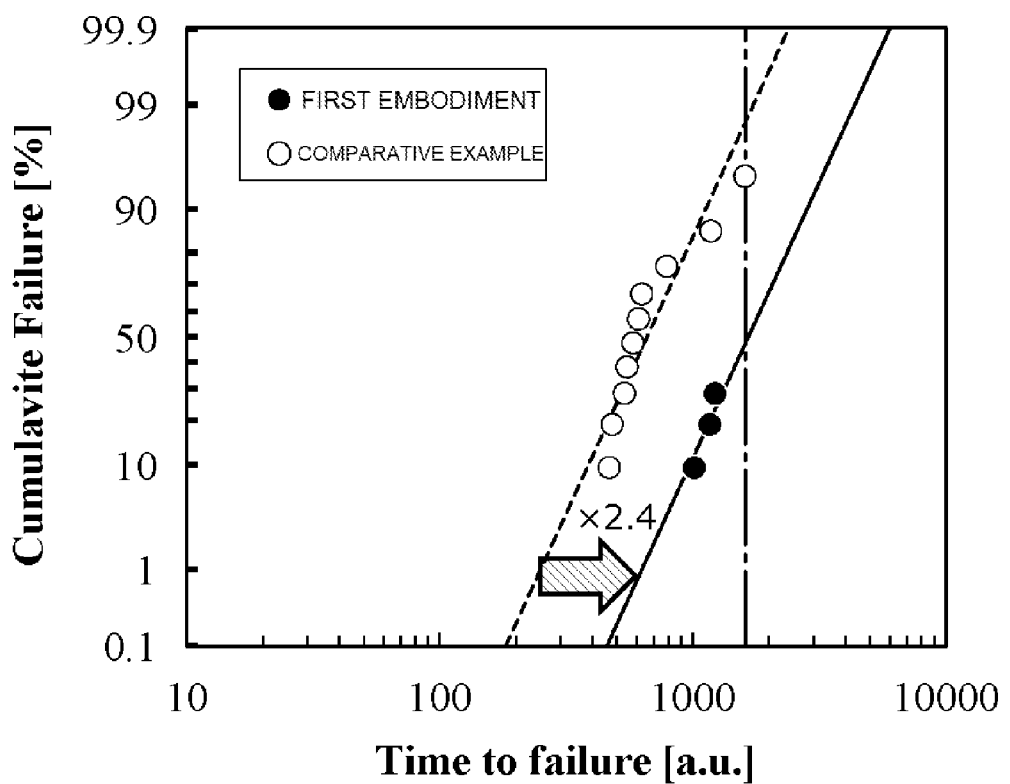
FIG. 14 is a graph showing electromigration characteristics of a layout according to the first embodiment and electromigration characteristics of a layout according to the comparative example.

FIG. 14 is a graph showing electromigration characteristics of a layout according to the present embodiment and electromigration characteristics of a layout according to the comparative example. In FIG. 14, a broken line is drawn between 1000 [a.u.] and 2000 [a.u.] on the horizontal axis. The broken line indicates an examination end time.

In FIG. 14, the inventors used TEG (Test Element Group) of the layout according to the present embodiment and TEG of the layout of the comparative example. Specifically, in the TEG according to the present embodiment, a drain pad DP has one drain electrode DE and a source pad SP has one source electrode SE. In the same way, in the TEG according to the comparative example, a drain pad DP has one drain electrode DE and a source pad SP has one source electrode SE.

As shown in FIG. 14, the electromigration lifetime according to the present embodiment is about 2.4 times the electromigration lifetime according to the comparative example. In this way, the electromigration resistance of the present embodiment is better than that of the comparative example. Hereinafter, the reason for the above will be described.

In general, the electromigration is a phenomenon in which wiring metal moves using momentum exchange by collision with electrons as a driving force. Therefore, the electromigration easily occurs in a region where the current density is high (a current concentration region). In the present embodiment and the comparative example, the current concentration region corresponds to a region from the drain pad DP to the drain electrode DE (FIGS. 1 and 13) and a region from the source pad SP to the source electrode SE (FIGS. 1 and 13).

In addition, in the present embodiment and the comparative example, $Al_3Ti$ may be a cause of the electromigration. As described above, the drain electrode DE (the source electrode SE) contains aluminum. On the other hand, the barrier metal film BM contains titanium. Additionally, the drain electrode DE (the source electrode SE) and the barrier metal film BM are in contact with each other. Therefore, the aluminum contained in the drain electrode DE (the source electrode SE) and the titanium contained in the barrier metal film BM may react with each other. In this case, $Al_3Ti$ is generated at an interface between the drain electrode DE (the source electrode SE) and the barrier metal film BM. In addition, in this case, a high speed diffusion path may be formed at an interface between the $Al_3Ti$ and a region around the $Al_3Ti$. The electromigration is caused by the high speed diffusion path.

In the present embodiment, as shown in FIG. 1, the side surface RDS of the recessed portion DRE and the side surface RSS of the recessed portion SRE enter the drain pad DP and the source pad SP, respectively, in the first direction (y direction). On the other hand, in the comparative example, as shown in FIG. 13, the side surface RDS of the recessed portion DRE and the side surface RSS of the recessed portion SRE enter the inside of the drain electrode DE and the inside of the source electrode SE, respectively, in the first direction (y direction). As obvious form this comparison, it is indicated that the recessed portion DRE is located at the end portion of the drain electrode DE, on the drain pad DP side (the recessed portion SRE is located at the end portion of the source electrode SE, on the source pad SP side) and thus the electromigration resistance is improved.

As a result of examination by the present inventors, it has become clear that, when the recessed portion REC is located at the end portion described above, the formation of the high speed diffusion path in the current concentration region is highly likely to be suppressed. Specifically, in the present embodiment, the recessed portion REC is located at the end portion described above. In this case, the laminated structure at the end portion is the drain electrode DE (the source electrode SE)/the barrier metal film BM/the nitride semiconductor layer NSL (for example, FIG. 3). On the other hand, in the comparative example, the recessed portion REC is not located at the end portion described above. In this case, the laminated structure at the end portion is the drain electrode DE (the source electrode SE)/the barrier metal film BM/the interlayer insulating film ILD. As obvious form this comparison, it is indicated that the above-described laminated structure of the present embodiment can more effectively suppress the formation of the high speed diffusion path than the above-described laminated structure of the comparative example.

The inventors observed the following two cross-sectional structures by using TEM (Transmission Electron Microscope). Thereby, the inventors examined the reason why the above-described laminated structure of the present embodiment can more effectively suppress the formation of the high speed diffusion path than the above-described laminated structure of the comparative example.

First, a cross section of a structure (Al/Ti/GaN) in which a GaN film, a Ti film, and an Al film are laminated in this order was observed. This structure corresponds to the above-described laminated structure of the present embodiment. As a result of the observation, it became clear that the Al film has a high orientation of (111). The reason for this is because the Al film may be formed over the GaN film. In other words, there is a high probability that the Al film succeeds the high orientation property of the GaN film. In other words, there is a probability that the Al film epitaxially grows by using the GaN film as a base.

Second, a cross section of a structure (Al/Ti/SiO$_2$) obtained by laminating a SiO$_2$ film, a Ti film, and an Al film in this order was observed. This structure corresponds to the above-described laminated structure of the comparative example. As a result of the observation, it became clear that the Al film has a low orientation of (111). The reason for this is because the Al film may be formed over the SiO$_2$ film.

According to a result of the observation described above, in the present embodiment, even when the Al$_3$Ti is formed, a region around the Al$_3$Ti has a high orientation property. There is a probability that the formation of the high speed diffusion path is suppressed by the high orientation property. On the other hand, in the comparative example, the orientation property of the region around the Al$_3$Ti is low. Therefore, when the Al$_3$Ti is formed, there is a probability that a high speed diffusion path is easily formed at an interface between the Al$_3$Ti and the region around the Al$_3$Ti. In this way, the electromigration resistance of the present embodiment is better than that of the comparative example.

As described above, according to the present embodiment, the recessed portion DRE is formed in a region overlapping with the drain electrode DE in a plan view. In the same way, the recessed portion SRE is formed in a region overlapping with the source electrode SE in a plan view. In addition, a part of the recessed portion DRE enters the drain pad DP in a plan view. In the same way, a part of the recessed portion SRE enters the source pad SP in a plan view. Thereby, the electromigration resistance of the drain electrode DE and the electromigration resistance of the source electrode SE become high.

Figure 15:
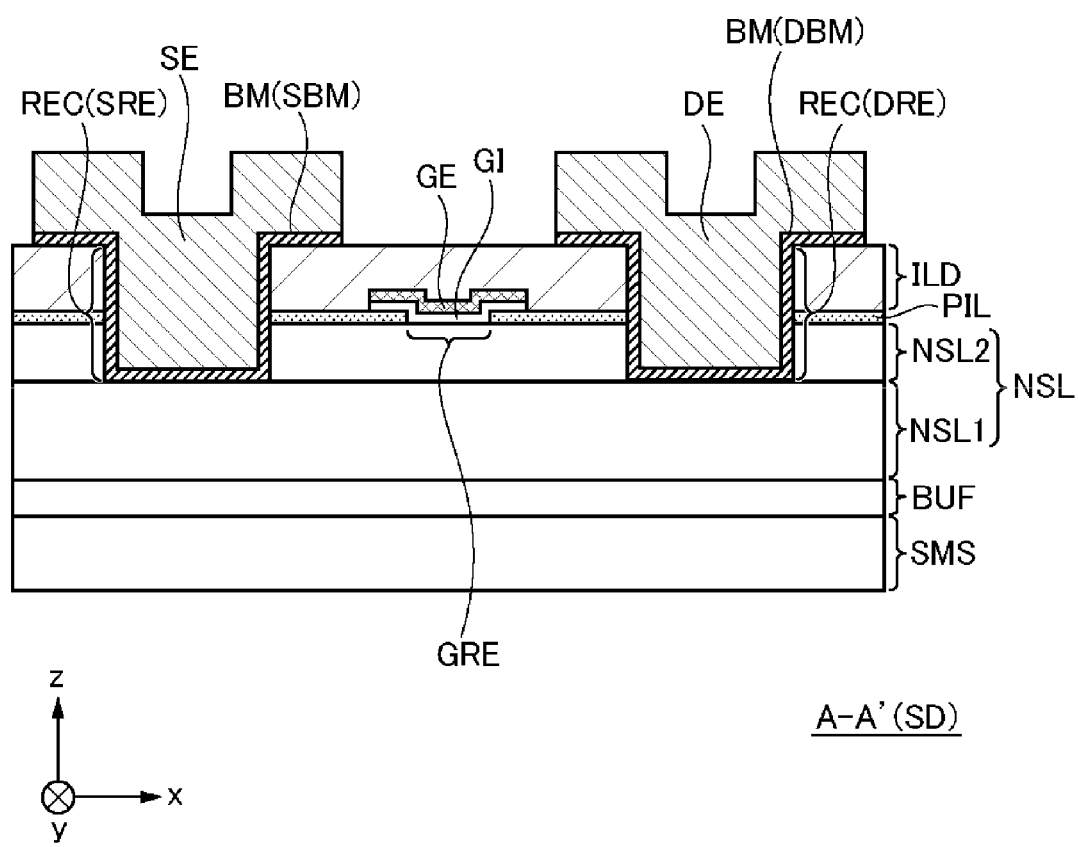
FIG. 15 is a diagram showing a first modification of FIG. 2.

FIG. 15 is a diagram showing a first modification of FIG. 2. As shown in FIG. 15, the lower ends of the recessed portions REC (the recessed portion DRE and the recessed portion SRE) may penetrate through the second nitride semiconductor layer NSL2. In the example shown in FIG. 15, the lower end of the recessed portion REC reaches the upper surface of the first nitride semiconductor layer NSL1. Also in the example shown in FIG. 15, the same effect as that of the present embodiment can be obtained.

Figure 16:
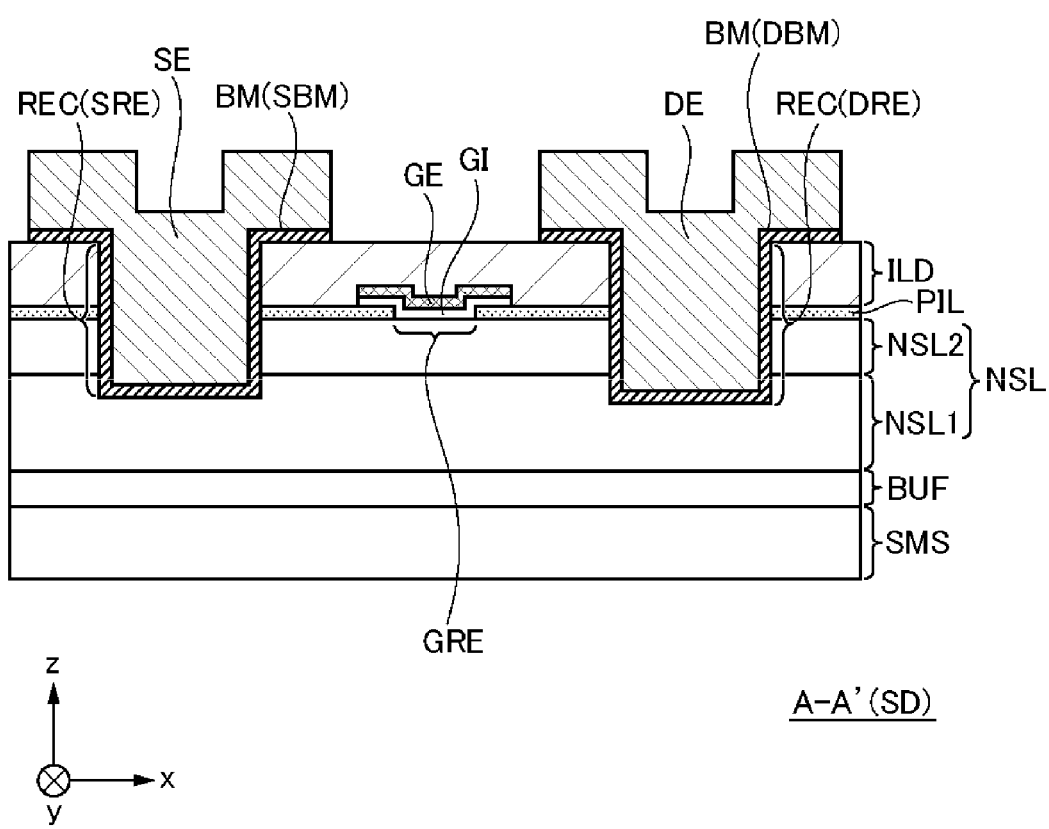
FIG. 16 is a diagram showing a second modification of FIG. 2.

FIG. 16 is a diagram showing a second modification of FIG. 2 and corresponds to a modification of FIG. 15. As shown in FIG. 16, the lower end of the recessed portion REC enters the first nitride semiconductor layer NSL1. In this case, the lower end of the recessed portion REC does not penetrate through the first nitride semiconductor layer NSL1. Also in the example shown in FIG. 16, the same effect as that of the present embodiment can be obtained.

Figure 17:
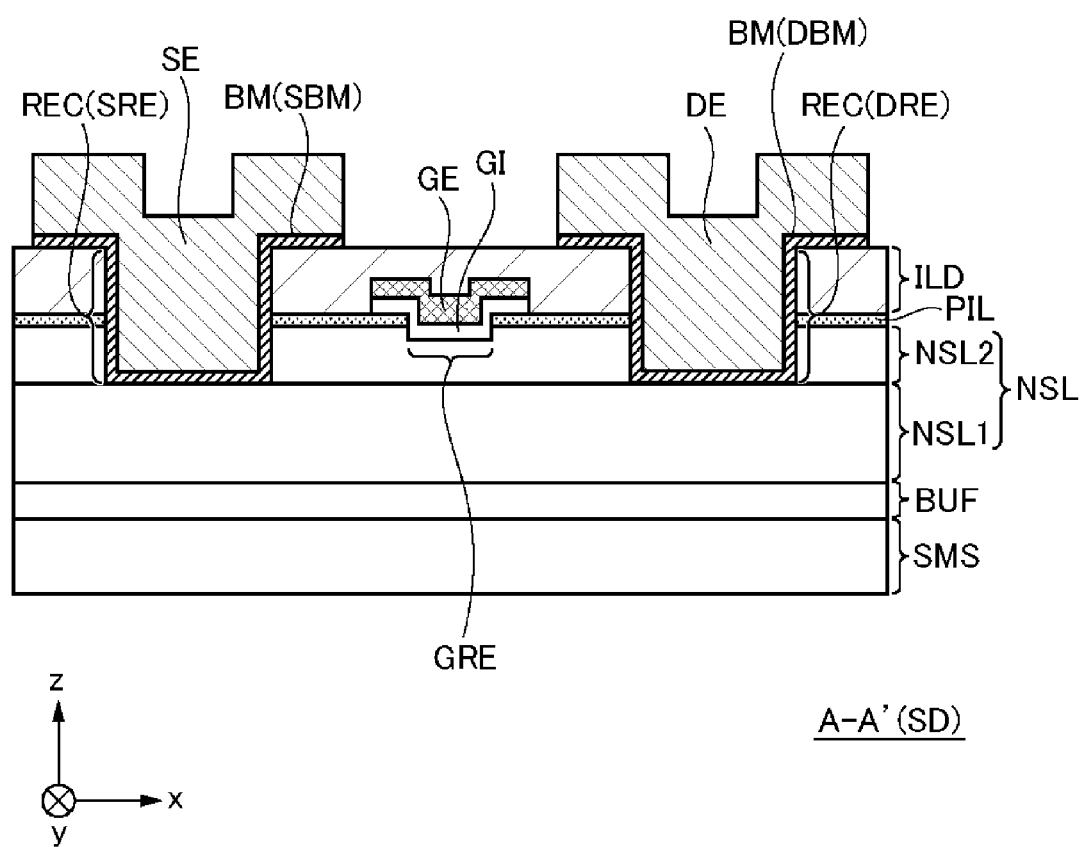
FIG. 17 is a diagram showing a third modification of FIG. 2.

FIG. 17 is a diagram showing a third modification of FIG. 2 and corresponds to a modification of FIG. 15. As shown in FIG. 17, the lower end of the recessed portion GRE may enter the second nitride semiconductor layer NSL2. In this case, the lower end of the recessed portion GRE does not penetrate through the second nitride semiconductor layer NSL2. Also in the example shown in FIG. 17, the same effect as that of the present embodiment can be obtained.

Figure 18:
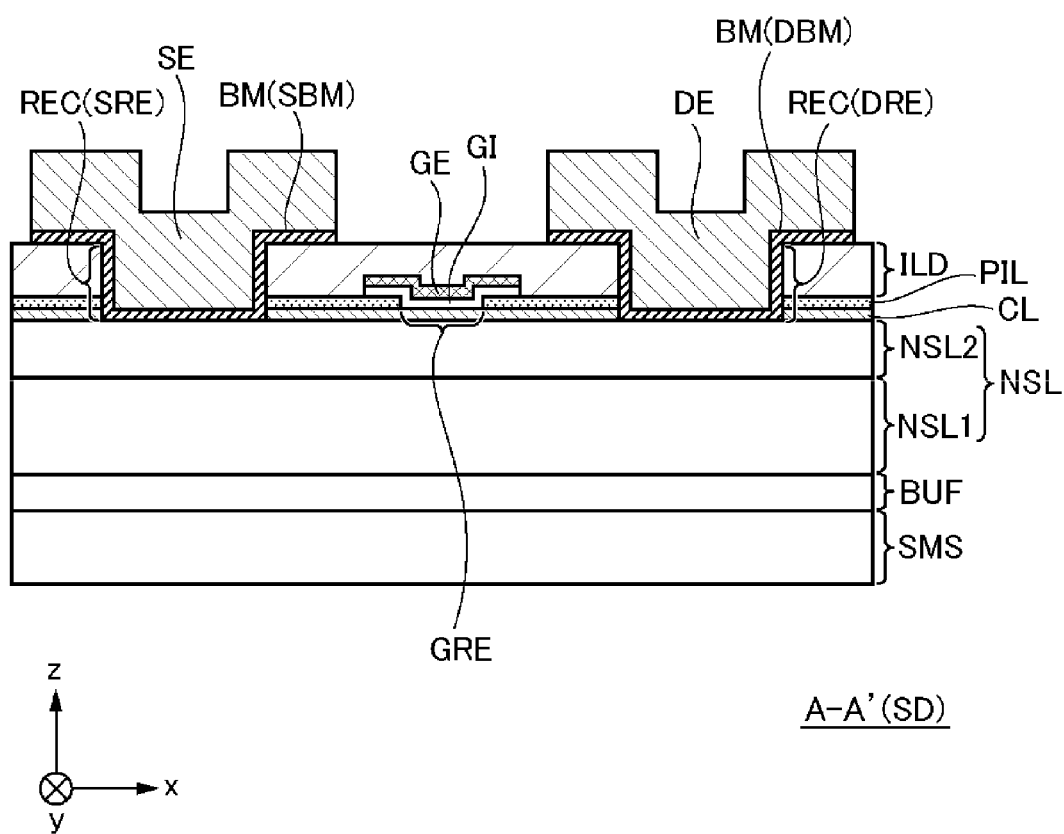
FIG. 18 is a diagram showing a fourth modification of FIG. 2.

FIG. 18 is a diagram showing a fourth modification of FIG. 2. As shown in FIG. 18, the cap layer CL may be provided between the second nitride semiconductor layer NSL2 and the protective insulating layer PIL. The cap layer CL is a nitride semiconductor layer, and more specifically, the cap layer CL is, for example, an undoped GaN film. The lower end of the recessed portion GRE penetrates through the protective insulating film PIL, and reaches the upper surface of the cap layer CL. The lower end of the recessed portion REC penetrates through the interlayer insulating film ILD, the protective insulating film PIL, and the cap layer CL and reaches the upper surface of the nitride semiconductor layer NSL (the second nitride semiconductor layer NSL2).

Also in the example shown in FIG. 18, the same effect as that of the present embodiment can be obtained. Furthermore, in the example shown in FIG. 18, the upper surface of the second nitride semiconductor layer NSL2 is covered by the cap layer CL. In this case, the second nitride semiconductor layer NSL2 is protected by the cap layer CL. In particular, when the second nitride semiconductor layer NSL2 is formed of AlGaN, the cap layer CL functions effectively. The Al contained in the AlGaN is readily oxidized. According to the example shown in FIG. 18, oxidization of the Al can be suppressed by the cap layer CL.

Figure 19:
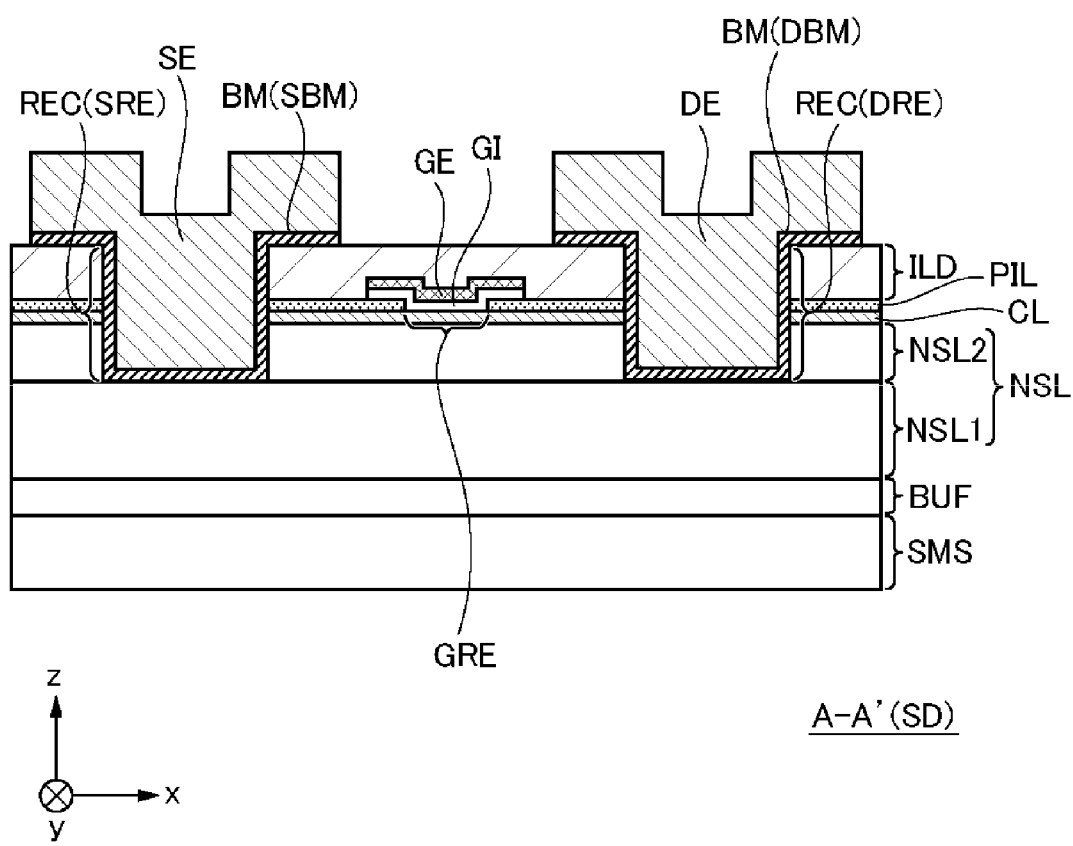
FIG. 19 is a diagram showing a fifth modification of FIG. 2.

FIG. 19 is a diagram showing a fifth modification of FIG. 2 and corresponds to a modification of FIG. 18. As shown in FIG. 19, the lower ends of the recessed portions REC (the recessed portion DRE and the recessed portion SRE) may penetrate through the second nitride semiconductor layer NSL2. In the example shown in FIG. 19, the lower end of the recessed portion REC reaches the upper surface of the first nitride semiconductor layer NSL1. Also in the example shown in FIG. 19, the same effect as that of the present embodiment can be obtained.

Figure 20:
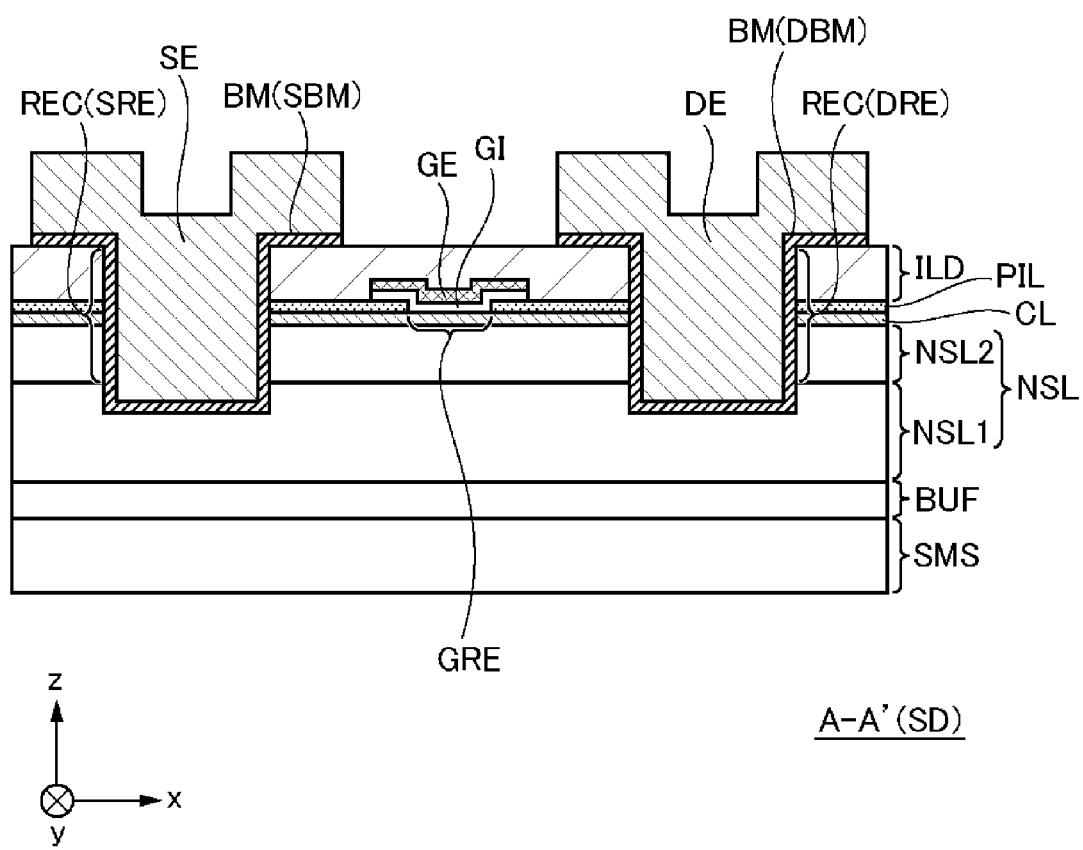
FIG. 20 is a diagram showing a sixth modification of FIG. 2.

FIG. 20 is a diagram showing a sixth modification of FIG. 2 and corresponds to a modification of FIG. 18. As shown in FIG. 20, the lower end of the recessed portion REC enters the first nitride semiconductor layer NSL1. In this case, the lower end of the recessed portion REC does not penetrate through the first nitride semiconductor layer NSL1. Also in the example shown in FIG. 20, the same effect as that of the present embodiment can be obtained.

Second Embodiment

Figure 21:
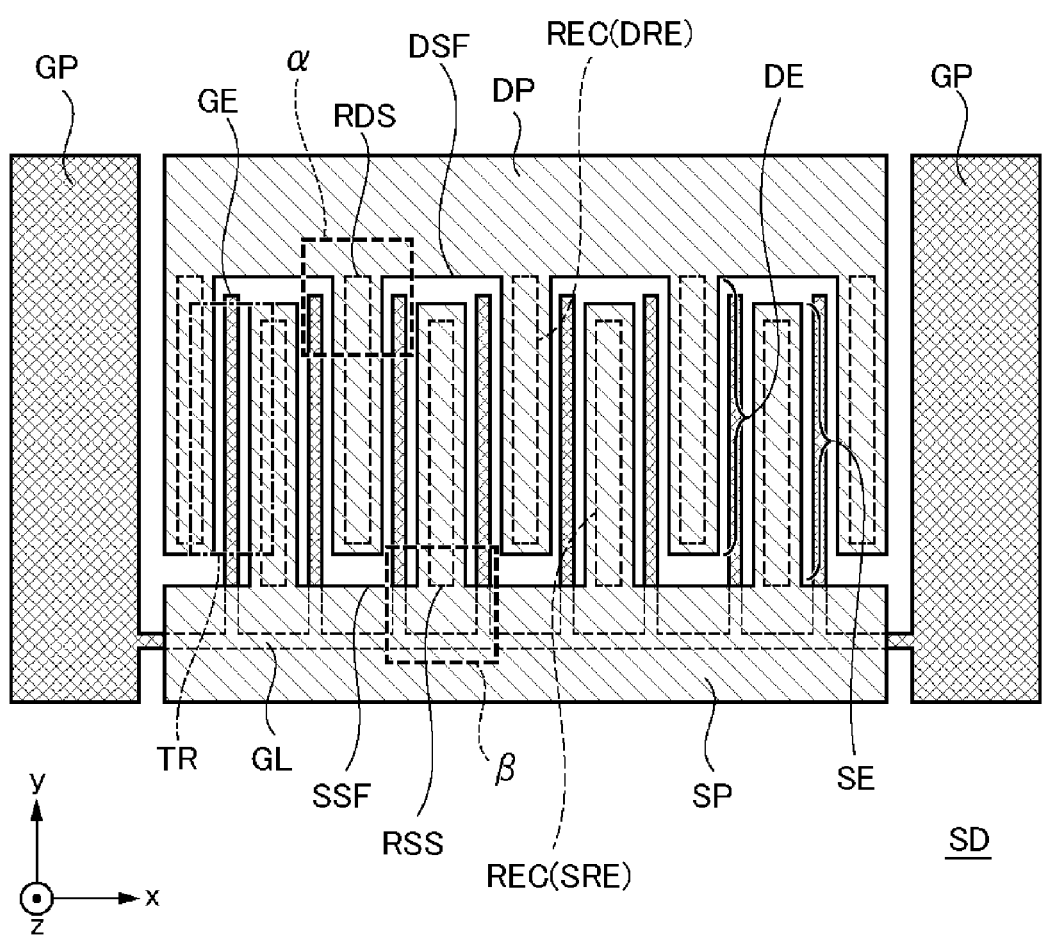
FIG. 21 is a plan view showing a configuration of a semiconductor device according to a second embodiment.

FIG. 21 is a plan view showing a configuration of a semiconductor device SD according to a second embodiment and corresponds to FIG. 1 of the first embodiment. The semiconductor device SD according to the present embodiment has the same configuration as that of the semiconductor device SD according to the first embodiment except for the following respects.

As shown in FIG. 21, also in the present embodiment, in the same way as in the first embodiment (FIG. 1), the recessed portion DRE is formed in a region overlapping with the drain electrode DE in a plan view. In the same way, the recessed portion SRE is formed in a region overlapping with the source electrode SE in a plan view.

Figure 22:
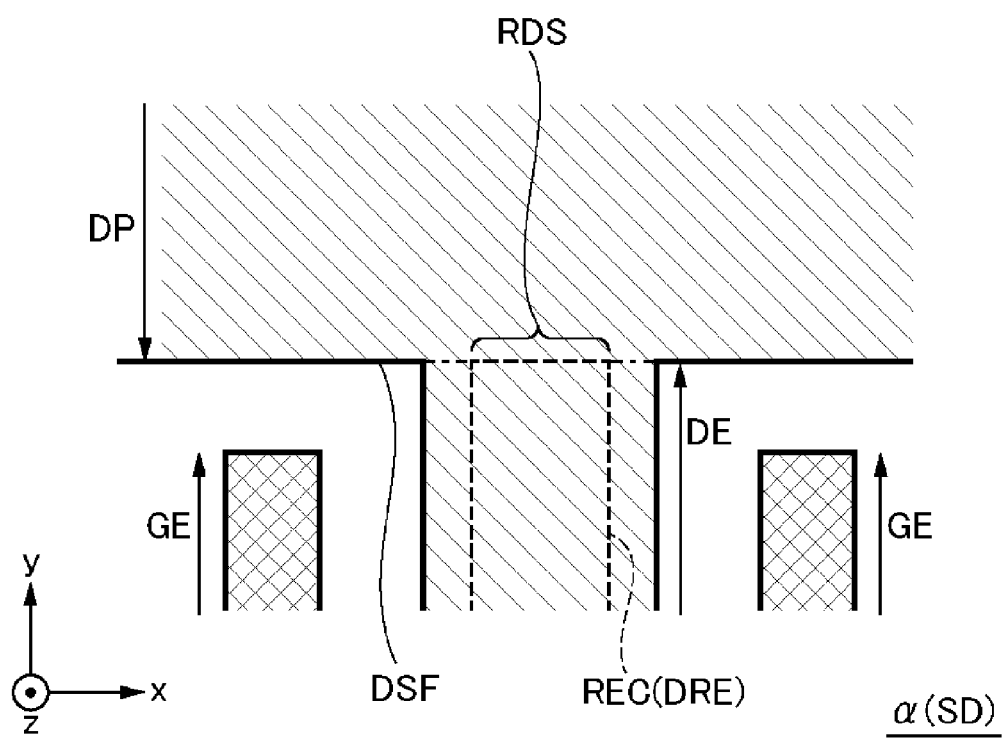
FIG. 22 is an enlarged view of a region surrounded by a dashed line α in FIG. 21.

FIG. 22 is an enlarged view of a region surrounded by a dashed line α in FIG. 21 and corresponds to FIG. 4 of the first embodiment. As shown in FIG. 22, the side surface RDS of the recessed portion DRE (the side surface of the recessed portion DRE, which faces the drain pad DP) reaches the side surface DSF of the drain pad DP (the side surface where the drain electrode DE is formed) in the first direction (y direction).

Figure 23:
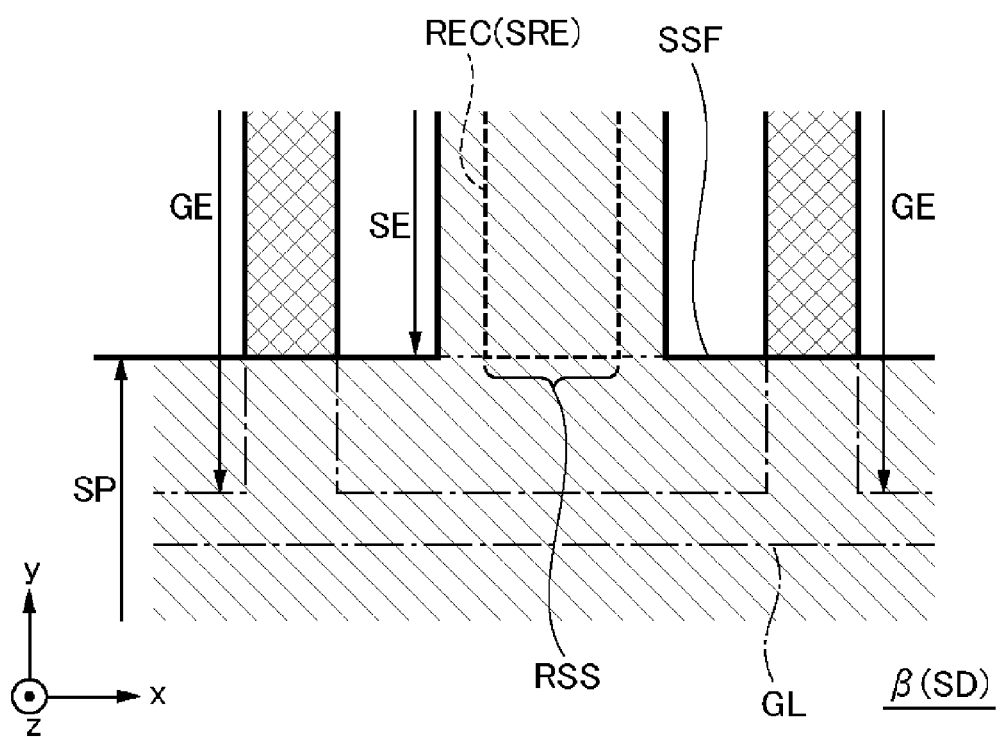
FIG. 23 is an enlarged view of a region surrounded by a dashed line β in FIG. 21.

FIG. 23 is an enlarged view of a region surrounded by a dashed line β in FIG. 21 and corresponds to FIG. 5 of the first embodiment. As shown in FIG. 23, the side surface RSS of the recessed portion SRE (the side surface the recessed portion SRE, which faces the source pad SP) reaches the side surface SSF of the source pad SP (the side surface where the source electrode SE is formed) in the first direction (y direction).

In the present embodiment, the recessed portion REC (the recessed portion DRE and the recessed portion SRE) does not enter the pad (the drain pad DP and the source pad SP) in a plan view. Even in this case, the recessed portion DRE is located at the end portion of the drain electrode DE, on the drain pad DP side. In the same way, the recessed portion SRE is located at the end portion of the source electrode SE, on the source pad SP side. Therefore, also in the present embodiment, the same effect as that of the first embodiment can be obtained.

Third Embodiment

Figure 24:
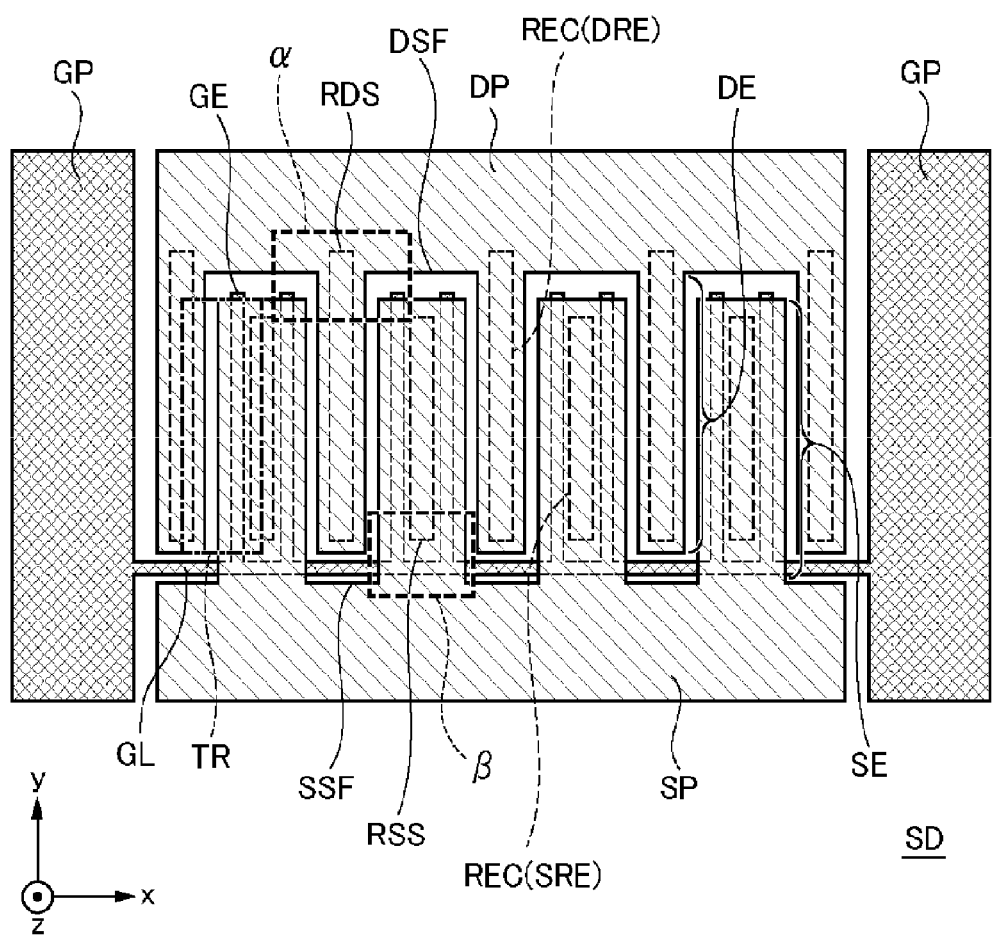
FIG. 24 is a plan view showing a configuration of a semiconductor device according to a third embodiment.

FIG. 24 is a plan view showing a configuration of a semiconductor device SD according to a third embodiment and corresponds to FIG. 1 of the first embodiment. The semiconductor device SD according to the present embodiment has the same configuration as that of the semiconductor device SD according to the first embodiment except for the following respects.

As shown in FIG. 24, also in the present embodiment, in the same way as in the first embodiment (FIG. 1), the drain electrode DE and the source electrode SE are repeatedly arranged in this order in the second direction (x direction). In addition, in the present embodiment, the width of the source electrode SE is larger than the width of the drain electrode DE. In this case, the current concentration from the source pad SP to the source electrode SE can be smaller than that in the first embodiment. Thereby, as described later in detail, the recessed portion SRE need not be located at the end portion of the source electrode SE, on the source pad SP side.

In addition, in the example shown in FIG. 24, the source electrode SE overlaps with at least a part of the gate electrode GE adjacent to the source electrode SE in a plan view. Specifically, the recessed portion SRE is located in a region overlapping with the source electrode SE in a plan view. Additionally, the gate electrode GE is located at both sides of the recessed portion SRE in the second direction (x direction). In this case, the source electrode SE includes these gate electrodes GE inside in the width direction (x direction). In this case, in the source electrode SE, a portion that covers the gate electrode GE functions as a field plate. Thereby, it is possible to alleviate electric field concentration in the gate electrode GE.

Note that, in the example shown in FIG. 24, the center-to-center distance between the gate electrode GE and the drain electrode DE is larger than the center-to-center distance between the gate electrode GE and the source electrode SE. Thereby, in each transistor TR, the distance between the gate and the drain is larger than the distance between the gate and the source. Thereby, it is possible to increase the withstand voltage between the gate and the drain.

Figure 25:
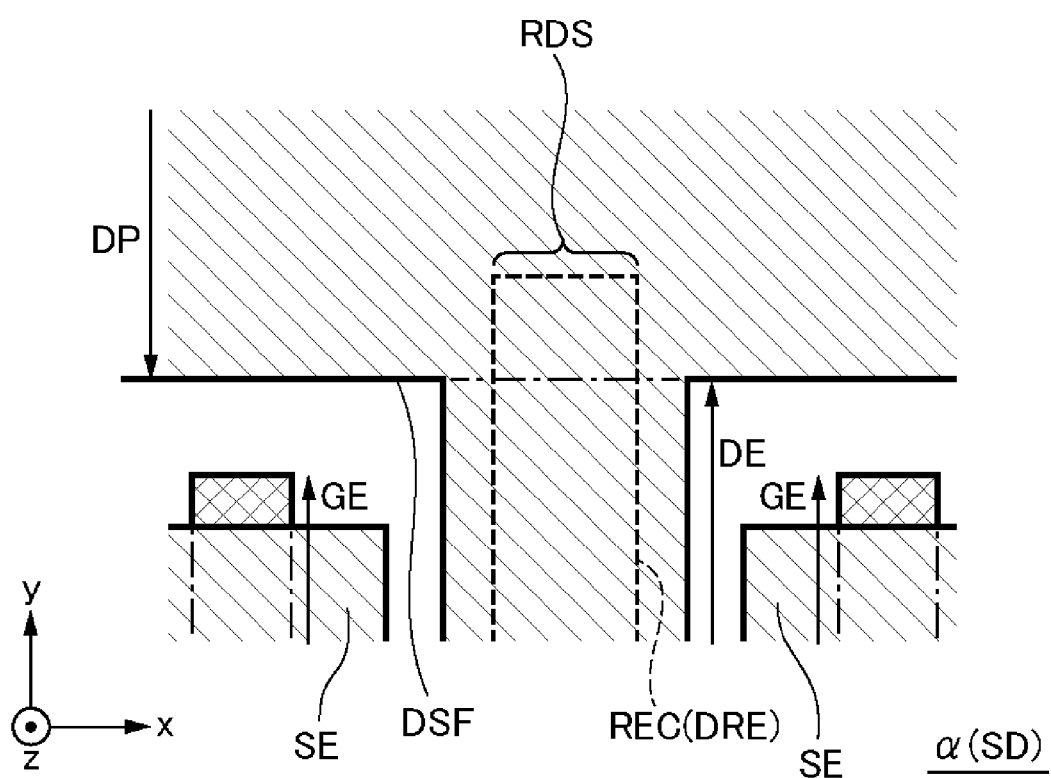
FIG. 25 is an enlarged view of a region surrounded by a dashed line α in FIG. 24.

FIG. 25 is an enlarged view of a region surrounded by a dashed line α in FIG. 24 and corresponds to FIG. 4 of the first embodiment. As shown in FIG. 25, also in the present embodiment, in the same way as in the first embodiment (FIG. 4), the side surface (the side surface RDS) of the recessed portion DRE, which faces the drain pad DP, enters the drain pad DP in the first direction (y direction). Furthermore, as described above, at least a part of the gate electrode GE overlaps with the source electrode SE in a plan view. In the example shown in FIG. 25, the tip of the gate electrode GE is located closer to the drain pad DP than the tip of the source electrode SE in the first direction (y direction).

Figure 26:
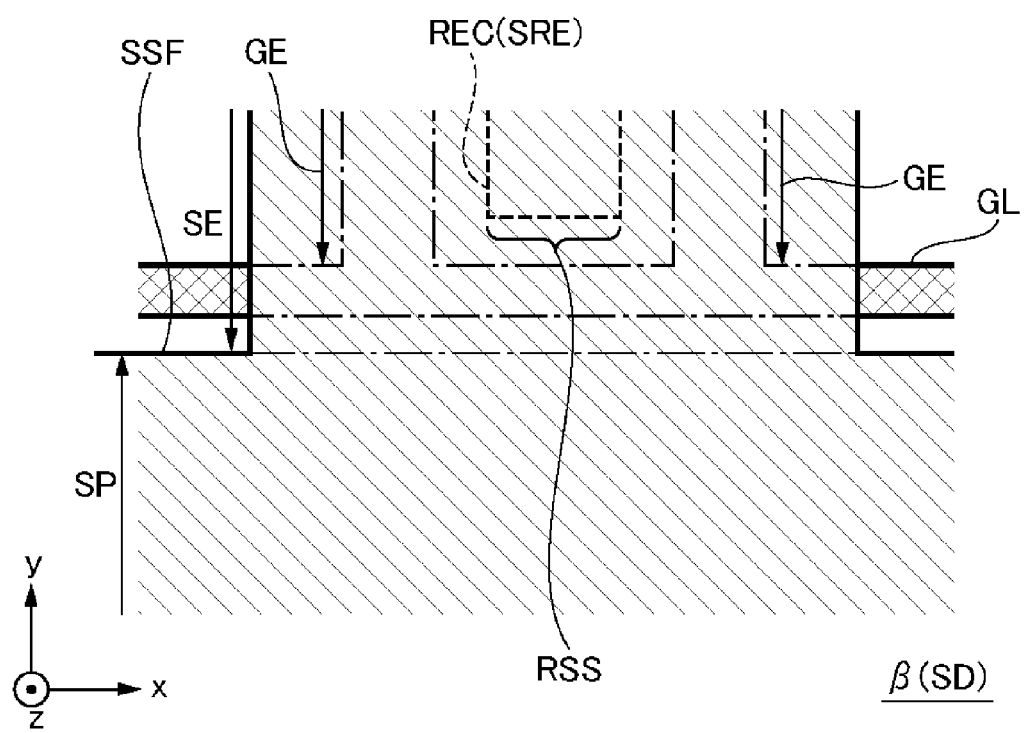
FIG. 26 is an enlarged view of a region surrounded by a dashed line β in FIG. 24.

FIG. 26 is an enlarged view of a region surrounded by a dashed line β in FIG. 24 and corresponds to FIG. 5 of the first embodiment. In the example shown in FIG. 26, the side surface RSS of the recessed portion SRE does not reach the side surface SSF of the source pad SP in the first direction (y direction) and does not also enter the source pad SP. Specifically, the gate wiring GL is located on the drain pad DP side as seen from the source pad SP in a plan view. Thereby, the recessed portion SRE is located closer to the drain pad DP than the side surface SSF of the source pad SP.

Also in the present embodiment, the same effect as that of the first embodiment can be obtained. Specifically, as shown in FIG. 24, the width of the source electrode SE is larger than the width of the drain electrode DE. Thereby, it is possible to alleviate the current concentration from the source pad SP to the source electrode SE. Therefore, even when the side surface RSS of the recessed portion SRE is caused to enter the inside of the source electrode SE in the first direction (y direction) (FIG. 26), it is possible to achieve a high electromigration resistance of the source electrode SE.

As described above, in the present embodiment, the recessed portion SRE need not be located at the end portion of the source electrode SE, on the source pad SP side (FIGS. 24 and 26). In this case, even when the position where the recessed portion SRE is actually formed is shifted closer to the drain pad DP side in the first direction (y direction) than a designed position, it is possible to achieve a high electromigration resistance of the source electrode SE.

Specifically, to achieve a high electromigration resistance of the source electrode SE in the layout of the first embodiment (FIG. 1), the recessed portion SRE needs to be caused to enter into the source pad SP in a plan view. In this case, if the position where the recessed portion SRE is actually formed is shifted closer to the drain pad DP in the first direction (y direction) than a designed position, the source electrode SE may not obtain a desired electromigration resistance. On the other hand, in the present embodiment, such a case is prevented from occurring.

Modification

Figure 27:
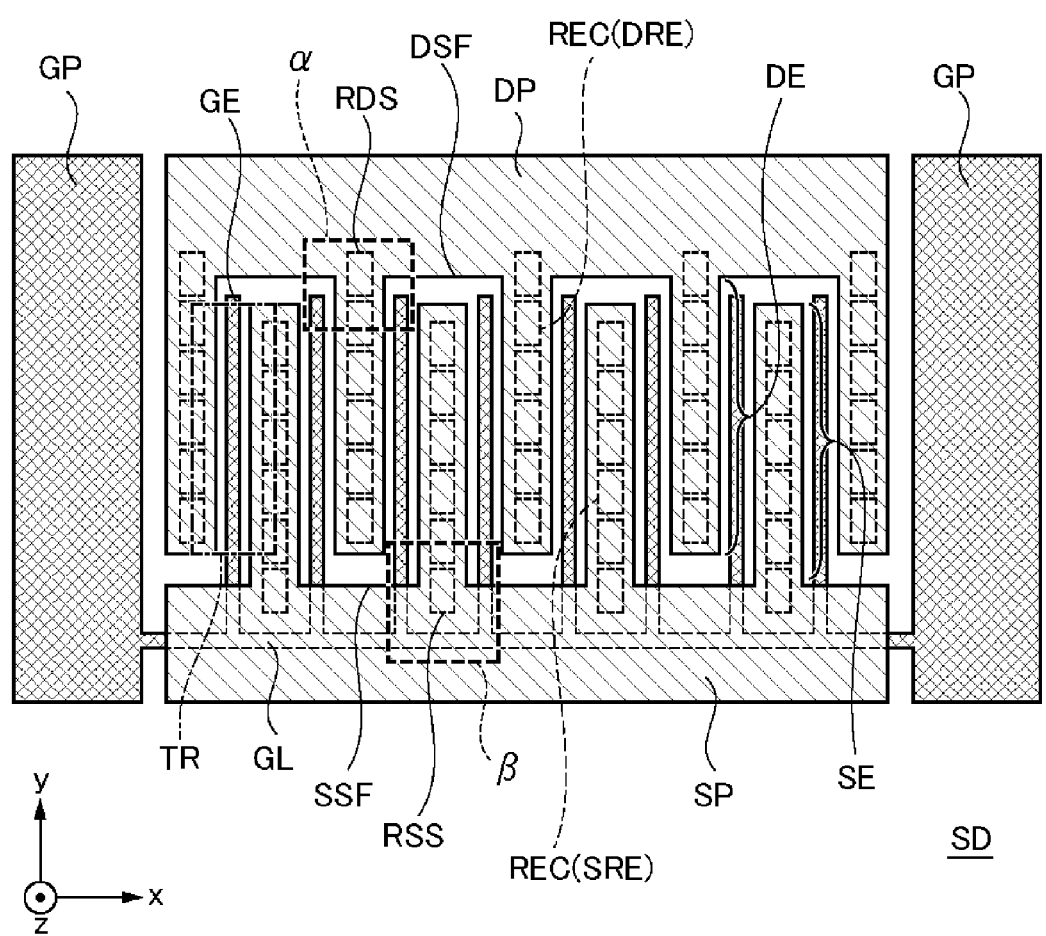
FIG. 27 is a diagram showing a modification of FIG. 1.

FIG. 27 is a diagram showing a modification of FIG. 1. As shown in FIG. 27, a plurality of recessed portions DRE may be arranged along the drain electrode DE. In the same way, a plurality of recessed portions SRE may be arranged along the source electrode SE. In other words, the recessed portion DRE need not extend along the drain electrode DE. In the same way, the recessed portion SRE need not extend along the source electrode SE. Note that, in the example shown in FIG. 27, the planar shape of the recessed portion REC (the recessed portion DRE and the recessed portion SRE) is rectangle.

However, the planar shape of the recessed portion REC is not limited to the example shown in FIG. 27.

In the example shown in FIG. 27, in the drain electrode DE and the source electrode SE adjacent to each other, the centers of the recessed portions DRE and the centers of the recessed portions SRE are alternately arranged in the first direction (y direction). However, the plan layout of the recessed portion DRE and the recessed portion SRE is not limited to the example shown in FIG. 27. For example, in the drain electrode DE and the source electrode SE adjacent to each other, the recessed portions DRE and the recessed portions SRE have the same planer shape, and the center of the recessed portion DRE and the center of the recessed portion SRE respectively correspond to each other in the first direction (y direction).

Figure 28:
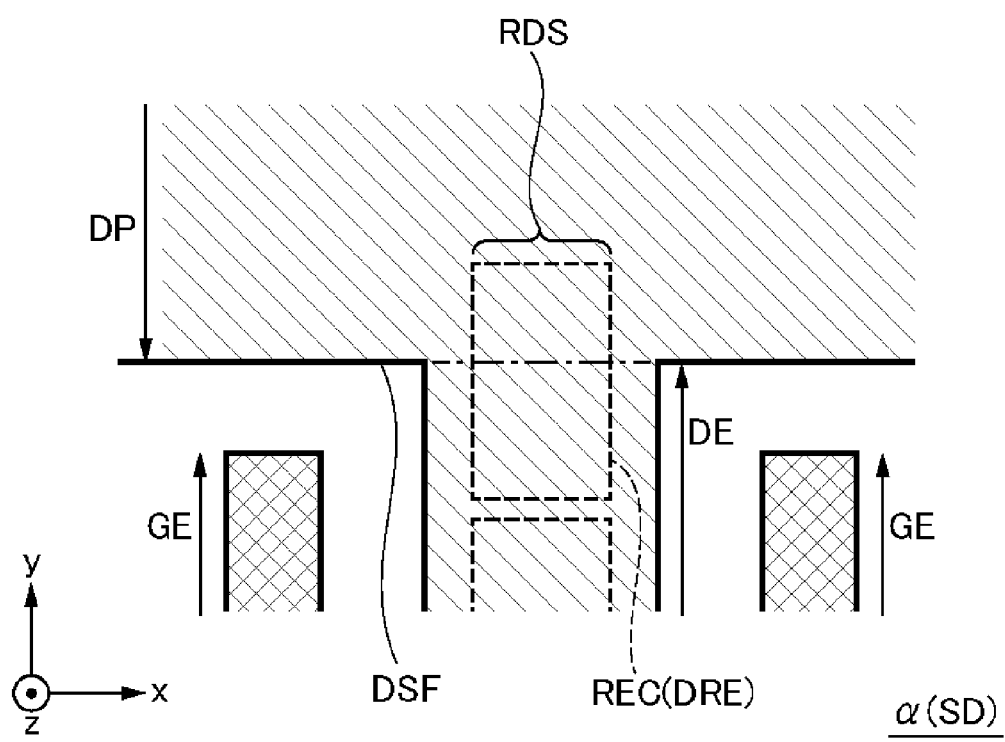
FIG. 28 is an enlarged view of a region surrounded by a dashed line α in FIG. 27.

FIG. 28 is an enlarged view of a region surrounded by a dashed line α in FIG. 27 and corresponds to FIG. 4 of the first embodiment. In the example shown in FIG. 28, one of the recessed portions DRE on the drain pad DP side enters the drain pad DP in a plan view. Specifically, the recessed portion DRE has a side surface (the side surface RDS) facing the drain pad DP. In addition, the side surface RDS enters the drain pad DP in the first direction (y direction). However, the side surface RDS may not enter the drain pad DP. For example, the side surface RDS may only reach the side surface DSF of the drain pad DP in the first direction (y direction).

Figure 29:
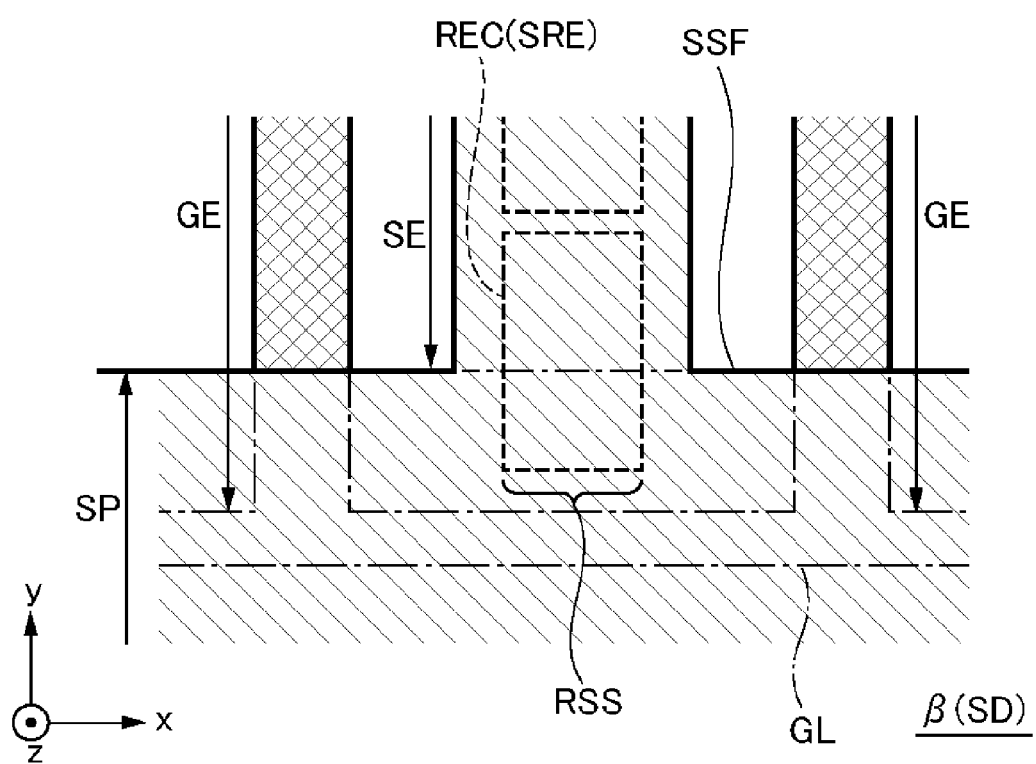
FIG. 29 is an enlarged view of a region surrounded by a dashed line β in FIG. 27.

FIG. 29 is an enlarged view of a region surrounded by a dashed line β in FIG. 27 and corresponds to FIG. 5 of the first embodiment. In the example shown in FIG. 29, one of the recessed portions SRE on the source pad SP side enters the source pad SP in a plan view. Specifically, the recessed portion SRE has a side surface (the side surface RSS) facing the source pad SP. In addition, the side surface RSS enters the source pad SP in the first direction (y direction). However, the side surface RSS may not enter the source pad SP. For example, the side surface RSS may only reach the side surface SSF of the source pad SP in the first direction (y direction).

While the invention made by the inventors has been specifically described on the basis of the embodiments, it is needless to say that the invention is not limited to the embodiments and can be modified variously without departing from the gist of the invention.

What is claimed is:

1. A semiconductor device comprising:
    a nitride semiconductor layer;
    an interlayer insulating film located over the nitride semiconductor layer;
    a wiring located over the interlayer insulating film;
    an electrode which is integrated with the wiring and is partially formed on a first side surface of the wiring and which extends from the first side surface in a first direction in a plan view;
    a recessed portion which is located in a region overlapping with the electrode in a plan view and is formed in the interlayer insulating film, a lower end of the recessed portion reaching the nitride semiconductor layer, at least a part of the electrode being buried in the recessed portion; and
    a barrier metal film formed along a bottom surface and side surfaces of the recessed portion, a bottom surface of the wiring, and a bottom surface of the electrode,
    wherein the wiring and the electrode contains aluminum,
    the barrier metal film contains titanium, and
    a side surface of the recessed portion, which faces the wiring, reaches the first side surface of the wiring or enters the wiring, in the first direction.

2. The semiconductor device according to claim 1, further comprising:
    a first transistor in which a drain, a gate electrode, and a source are arranged in this order in a second direction intersecting the first direction in a plan view;
    a drain pad extending in the second direction;
    a drain electrode which extends from the drain pad in the first direction and which is electrically coupled to the drain;
    a source pad which faces the drain pad via the drain electrode in the first direction and which extends in the second direction; and
    a source electrode which extends from the source pad toward the drain pad in the first direction and which is electrically coupled to the source,
    wherein the wiring and the electrode are the drain pad and the drain electrode, respectively, or the source pad and the source electrode, respectively.

3. The semiconductor device according to claim 2, further comprising:
    a second transistor in which a drain, a gate electrode, and a source are arranged in the second direction in an order opposite to that in the first transistor in a plan view and the source is electrically coupled to the same source electrode as the source of the first transistor; and
    a gate wiring which is located closer to the source pad than the drain electrode in a plan view and which couples the gate electrode of the first transistor with the gate electrode of the second transistor,
    wherein the wiring and the electrode are the source pad and the source electrode, respectively,
    the recessed portion is sandwiched by the gate electrode of the first transistor and the gate electrode of the second transistor and is located closer to the drain pad than the gate wiring in a plan view, and
    the gate wiring, the first side surface, and the source electrode are arranged in this order in the first direction.

4. The semiconductor device according to claim 2,
    wherein the wiring and the electrode are the drain pad and the drain electrode, respectively, and
    a width of the source electrode is larger than a width of the drain electrode.

5. The semiconductor device according to claim 4,
    wherein the source electrode overlaps with at least a part of the gate electrode in a plan view.

6. The semiconductor device according to claim 1,
    wherein the barrier metal film is a single layer film formed of titanium.

7. The semiconductor device according to claim 6,
    wherein a film formed of titanium nitride is not included between the barrier metal film and the electrode.

8. The semiconductor device according to claim 6,
    wherein the barrier metal film is directly coupled to the electrode.

* * * * *